US012751219B2

(12) United States Patent
Kamikawa et al.

(10) Patent No.: US 12,751,219 B2
(45) Date of Patent: Sep. 29, 2026

(54) SEMICONDUCTOR SUBSTRATE, METHOD FOR PRODUCING SEMICONDUCTOR SUBSTRATE, SEMICONDUCTOR SUBSTRATE PRODUCTION DEVICE, ELECTRONIC COMPONENT, AND ELECTRONIC DEVICE

(71) Applicant: KYOCERA Corporation, Kyoto (JP)

(72) Inventors: Takeshi Kamikawa, Kyoto (JP); Katsuaki Masaki, Kyoto (JP); Yuichiro Hayashi, Kyoto (JP); Toshihiro Kobayashi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 535 days.

(21) Appl. No.: 18/270,080

(22) PCT Filed: Dec. 28, 2021

(86) PCT No.: PCT/JP2021/048833
§ 371 (c)(1),
(2) Date: Jun. 28, 2023

(87) PCT Pub. No.: WO2022/145453
PCT Pub. Date: Jul. 7, 2022

(65) Prior Publication Data

US 2024/0322078 A1 Sep. 26, 2024

(30) Foreign Application Priority Data

Dec. 29, 2020 (JP) ................................ 2020-219849

(51) Int. Cl.
*H10P 14/20* (2026.01)
*H10H 20/01* (2025.01)
(Continued)

(52) U.S. Cl.
CPC ... *H10P 14/2904* (2026.01); *H10H 20/01335* (2025.01); *H10H 20/8215* (2025.01);
(Continued)

(58) Field of Classification Search
CPC .... H10P 14/2904; H10P 14/24; H10P 14/272; H10P 14/276; H10P 14/2905;
(Continued)

(56) References Cited

U.S. PATENT DOCUMENTS 4,914,053 A 4/1990 Matyi et al.
6,252,261 B1 6/2001 Usui et al.
(Continued)

FOREIGN PATENT DOCUMENTS

JP 2000-349338 A 12/2000
JP 2001-230410 A 8/2001
(Continued)

OTHER PUBLICATIONS

A. Usui et al., "Thick Gan Epitaxial Growth with . . . ", Japanese Journal of Applied Physics, vol. 36, p. L899-L902.
(Continued)

*Primary Examiner* — Julia Slutsker
(74) *Attorney, Agent, or Firm* — Volpe Koenig

(57) ABSTRACT

A semiconductor substrate includes a base substrate, a mask layer including an opening portion and a mask portion, and a GaN-based semiconductor layer that includes a GaN-based semiconductor. The GaN-based semiconductor layer includes: a first portion located on the mask portion; and a second portion that is located on the opening portion and has a lower dislocation density of non-threading dislocations in a cross section of the GaN-based semiconductor layer taken along a thickness direction than the first portion.

20 Claims, 12 Drawing Sheets

(51) Int. Cl.

| | |
|---|---|
| ***H10H 20/81*** | (2025.01) |
| ***H10H 20/825*** | (2025.01) |
| ***H10P 14/24*** | (2026.01) |
| ***H10W 90/00*** | (2026.01) |

(52) U.S. Cl.
CPC ........... *H10H 20/825* (2025.01); *H10P 14/24* (2026.01); *H10P 14/272* (2026.01); *H10P 14/276* (2026.01); *H10P 14/2905* (2026.01); *H10P 14/2921* (2026.01); *H10P 14/2926* (2026.01); *H10P 14/3216* (2026.01); *H10P 14/3252* (2026.01); *H10P 14/3254* (2026.01); *H10P 14/3416* (2026.01); *H10P 14/3444* (2026.01); *H10W 90/00* (2026.01)

(58) Field of Classification Search
CPC ............. H10P 14/2921; H10P 14/2926; H10P 14/3216; H10H 20/01335; H10H 20/8215
See application file for complete search history.

(56) References Cited

U.S. PATENT DOCUMENTS

| | | | | |
|---|---|---|---|---|
| 2001/0040246 | A1* | 11/2001 | Ishii | H10D 30/021 257/E21.441 |
| 2005/0003572 | A1* | 1/2005 | Hahn | H10H 20/01335 257/E21.127 |
| 2007/0217460 | A1* | 9/2007 | Ishibashi | H01S 5/34333 372/45.01 |
| 2012/0280363 | A1 | 11/2012 | Sumida et al. | |
| 2017/0358443 | A1 | 12/2017 | Tak et al. | |
| 2020/0224331 | A1 | 7/2020 | D'Evelyn et al. | |

FOREIGN PATENT DOCUMENTS

| | | | |
|---|---|---|---|
| JP | 2004-336040 | A | 11/2004 |
| JP | 2011-066398 | A | 3/2011 |
| JP | 2012-114263 | A | 6/2012 |
| JP | 2013-251304 | A | 12/2013 |

OTHER PUBLICATIONS

Romanov, A. E., et al., "Modeling the extended defect evolution in lateral epitaxial overgrowth of GaN: Subgrain stability", Journal of Applied Physics, American Institute of Physics, New York, (2003).

Honda, Y., et al., "Transmission Electron Microscopy Investigation of Dislocations in GaN Layer Grown by Facet-Controlled Epitaxial Lateral Overgrowth", Japanese Journal of Applied Physics, Japan, (2001).

* cited by examiner

SEMICONDUCTOR SUBSTRATE, METHOD FOR PRODUCING SEMICONDUCTOR SUBSTRATE, SEMICONDUCTOR SUBSTRATE PRODUCTION DEVICE, ELECTRONIC COMPONENT, AND ELECTRONIC DEVICE

TECHNICAL FIELD

The present disclosure relates to a semiconductor substrate, a method for producing a semiconductor substrate, an electronic component, and an electronic device, and more particularly relates to a semiconductor substrate applicable to a gallium-nitride-based semiconductor element and a method for producing the same, as well as an electronic component and an electronic device including the gallium-nitride-based semiconductor element.

BACKGROUND OF INVENTION

A semiconductor device using gallium nitride (GaN) generally has higher power conversion efficiency than a semiconductor device made of silicon (Si). Thus, the semiconductor device using GaN has small power loss compared with the semiconductor device made of Si, and thus is expected to achieve power saving.

Research has been conducted on a technique for forming a GaN-based semiconductor element, for producing a semiconductor device using GaN. In general, a GaN-based thin film formed on a substrate by semiconductor thin film growth has many defects (defects in a crystal lattice) such as threading dislocations.

As a technique for reducing such threading dislocations in the GaN-based thin film, a selective growth technique such as an epitaxial lateral overgrowth (ELO) method is known (see, for example, Patent Document 1, Patent Document 2, and Non-Patent Document 1).

Specifically, Non-Patent Document 1 describes a technique for forming a GaN-based semiconductor layer by the ELO method using a base substrate in which a GaN foundation layer and a silicon oxide ($SiO_2$) layer that has an opening portion are formed in this order on a sapphire substrate.

CITATION LIST

Patent Literature

Patent Document 1: JP 2013-251304 A
Patent Document 2: JP 2011-66398 A

Non-Patent Literature

Non-Patent Document 1: A. Usui, H. Sunakawa, A. Sasaki, and A. Yamaguchi, "Thick GaN Epitaxial Growth with Low Dislocation Density by Hydride Vapor Phase Epitaxy", Japanese Journal of Applied Physics, Jul. 15, 1997, vol. 36, Pt. 2, No. 7B, p. L899-L902

SUMMARY

A semiconductor substrate according to an aspect of the present disclosure includes: a base substrate; a mask layer that is located on the base substrate and includes an opening portion and a mask portion; and a semiconductor layer that includes a GaN-based semiconductor and is located over the base substrate exposed through the opening portion and over the mask portion. The semiconductor layer includes: a first portion located on the mask portion; and a second portion that is located on the opening portion and has a lower dislocation density of non-threading dislocations in a cross section of the semiconductor layer taken along a thickness direction, than the first portion.

A semiconductor substrate according to an aspect of the present disclosure includes: a base substrate; a mask layer that is located on the base substrate and includes an opening portion and a mask portion; and a semiconductor layer that includes a GaN-based semiconductor and is located over the base substrate exposed through the opening portion and the mask portion. The semiconductor layer includes a first portion located on the mask portion and including non-threading dislocations, and has a threading dislocation density of $5\times10^6/cm^2$ or lower.

A method for producing a semiconductor substrate according to an aspect of the present disclosure includes: preparing a template substrate including a base substrate and a mask layer that is located in a layer above the base substrate and includes an opening portion and a mask portion; and forming a first portion that is located on the mask portion and includes a GaN-based semiconductor, and a second portion that is located on the opening portion and includes a GaN-based semiconductor, with a dislocation density of non-threading dislocations being lower in a cross section of the second portion taken along a thickness direction than in a cross section of the first portion taken along the thickness direction.

A semiconductor substrate production device according to an aspect of the present disclosure includes: a semiconductor layer forming unit configured to form on a template substrate including a base substrate and a mask layer that is located in a layer above the base substrate and includes an opening portion and a mask portion, a first portion that is located on the mask portion and includes a GaN-based semiconductor, and a second portion that is located on the opening portion and includes a GaN-based semiconductor, with a dislocation density of non-threading dislocations being lower in a cross section of the second portion taken along a thickness direction than in a cross section of the first portion taken along the thickness direction; and a control unit configured to control the semiconductor layer forming unit.

DESCRIPTION OF EMBODIMENTS

Figure 1A:
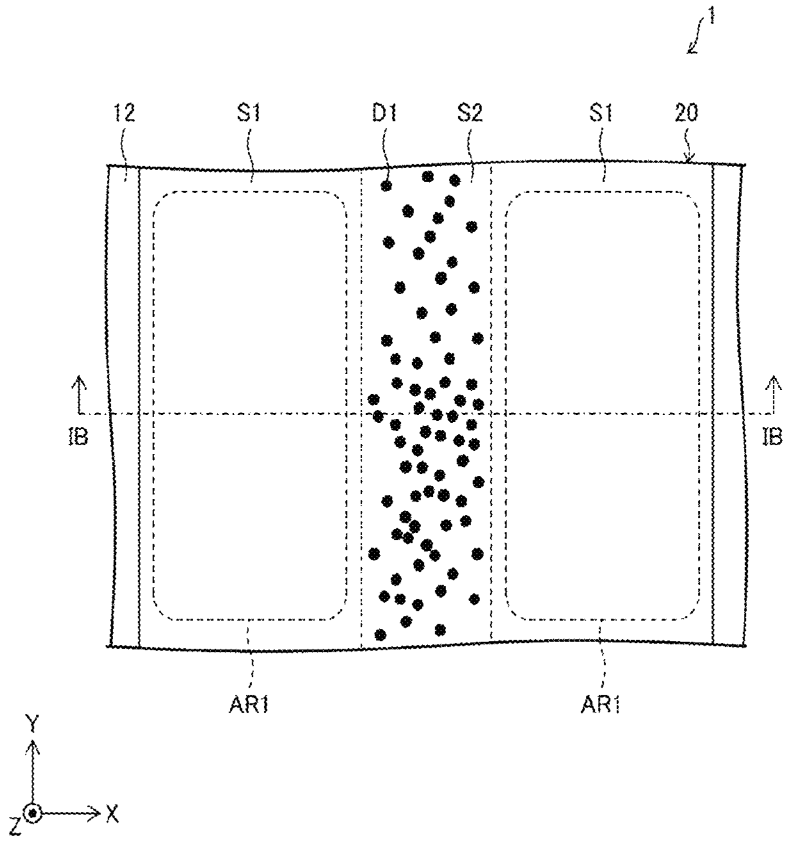
FIG. 1A is a plan view schematically illustrating dislocations in a semiconductor substrate according to a first embodiment of the present disclosure.

An embodiment will be described below with reference to the drawings. Note that the following description is for better understanding of the gist of the invention and does not limit the present disclosure unless otherwise specified. Unless otherwise specified in the present specification, "from A to B" representing a numerical value range means "A or more and B or less". Shapes and dimensions (length, width, and the like) of configurations illustrated in the drawings in the present application do not necessarily reflect actual shapes and dimensions, and are appropriately changed for clarification and simplification of the drawings.

In the following description, in order to facilitate understanding of a semiconductor substrate and a method for producing the same according to an aspect of the present disclosure, first, findings of the present disclosure will be schematically described.

Summary of Findings of Present Disclosure

In general, when a GaN-based semiconductor layer is produced on a substrate, various problems exist, such as production of defects (such as threading dislocations) in the GaN-based semiconductor layer. These problems are particularly serious when a substrate (hereinafter, may be referred to as a heterogeneous substrate) made of a material different from that of a GaN-based semiconductor is used to produce a GaN-based semiconductor layer on the heterogeneous substrate.

To reduce the defects in the GaN-based semiconductor layer, for example, a GaN-based semiconductor layer (also referred to as "ELO-GaN-based semiconductor layer") may be formed by an ELO method. Specifically, using a growth mask layer having a stripe-shaped mask portion and a stripe-shaped opening portion, a GaN-based semiconductor layer is grown from the opening portion and the GaN-based semiconductor layer is laterally grown over the mask portion. One device is manufactured based on a plurality of ELO-GaN-based semiconductor layers grown from a plurality of the opening portions.

In recent years, there has been an increasing demand for micro-chip devices such as micro-LEDs for example. For example, in a GaN-based micro LED that emits red light, the requirement regarding the defects is strict, that is, a semiconductor substrate including a high-quality GaN-based semiconductor layer is required. If an ELO-GaN-based semiconductor layer having an active region with a larger area than known ones can be obtained, a semiconductor substrate having such an ELO-GaN-based semiconductor layer can be suitably used for producing, for example, a GaN-based semiconductor element (for example, a micro LED chip).

There are few reported cases of formation of a GaN-based semiconductor layer having a large width by the known ELO method. One reason for this is that it is not easy to form a wide high-quality GaN-based semiconductor layer using the ELO method. It is not clear what kinds of defects occur in the ELO-GaN-based semiconductor layer formed to be wide in the lateral direction on the mask portion (formed by laterally growing the ELO-GaN-based semiconductor layer to be wide in the lateral direction), and there has not been enough research so far on what causes defects in the ELO-GaN-based semiconductor layer and how the defects can be reduced.

In view of the above, the present inventors have made intensive studies, and as a result have generally found the following. Specifically, a detailed investigation has been made on defects (for example, dislocations and impurities) in the ELO-GaN-based semiconductor layer (first portion described below) on the mask portion. As a result, conditions that can improve the quality of a region where a device can be formed on the surface of the first portion described above have been found.

It has been found that, a semiconductor substrate according to an aspect of the present disclosure has an ELO-GaN-based semiconductor layer formed to have a relatively large width with a mask portion of a growth mask layer being wider than that in a known configuration, and still has a large area of a high-quality region where the device can be formed.

This can be achieved by, for example, actively producing dislocations (typically, basal plane dislocations) inside the ELO-GaN-based semiconductor layer on the mask portion. Specifically, with the dislocations actively produced in the ELO-GaN-based semiconductor layer, (i) the internal stress of the ELO-GaN-based semiconductor layer on the mask portion can be relaxed, and (ii) the density of dislocations in the surface of the ELO-GaN-based semiconductor layer on the mask portion and in the vicinity of the surface can be effectively reduced. As far as the inventors of the present inventors know, there are few reported cases of dislocations in the ELO-GaN-based semiconductor layer on the mask portion.

First Embodiment

Embodiments of the present disclosure will be described below with reference to the drawings. In the present embodiment, a semiconductor substrate having a single GaN-based semiconductor layer will be described for the sake of simplicity. As will be described in detail below, in the semiconductor substrate of the present embodiment, a part of the GaN-based semiconductor layer may be removed by etching or the like, and in this case, the single GaN-based semiconductor layer may be divided. It goes without saying that the scope of the semiconductor substrate according to an aspect of the present disclosure includes a semiconductor substrate thus having a plurality of GaN-based semiconductor layers formed this way.

Dislocations on Surface and Inside of GaN-Based Semiconductor Layer

Figure 1B:
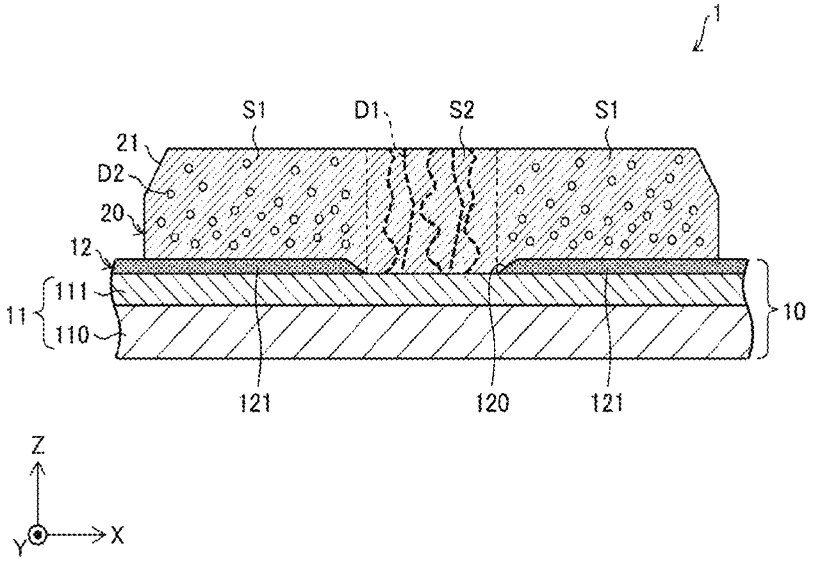
FIG. 1B is a cross-sectional view taken along line IB-IB indicated by arrows in FIG. 1A, and schematically illustrates dislocations in the semiconductor substrate.

First, dislocations produced in a GaN-based semiconductor layer of a semiconductor substrate according to one embodiment of the present disclosure will be described with reference to FIG. 1 and FIG. 2. FIG. 1A is a plan view schematically illustrating dislocations present in a surface of a semiconductor substrate 1 according to the present embodiment (dislocations observable on the surface). FIG. 1B is a cross-sectional view of the semiconductor substrate 1 taken along line IB-IB indicated by arrows in FIG. 1A, and schematically illustrates defects in the semiconductor substrate 1 (dislocations observable in the cross section).

As illustrated in FIG. 1A and FIG. 1B, the semiconductor substrate 1 includes a template substrate 10 and a GaN-based semiconductor layer 20. The template substrate 10 includes a base substrate 11 and a mask layer 12. The base substrate 11 includes a main substrate 110 and a foundation layer (semiconductor film) 111. The mask layer 12 includes an opening portion 120 and a mask portion 121. The GaN-based semiconductor layer 20 includes GaN or a GaN-based semiconductor, and is located over the base substrate 11 exposed in the opening portion 120 and over the mask portion 121. Each part of the semiconductor substrate 1 will be described in detail below. The GaN-based semiconductor includes a semiconductor containing gallium atoms (Ga) and nitrogen atoms (N) (for example, GaN, AlGaN, AlGaInN, and InGaN), as well as AlN, AlInN, and InN. When a Si substrate, a SiC substrate, or a sapphire substrate is used as the main substrate 110, an AlN layer may be formed so as to be in direct contact with the main substrate 110. In this case, the crystallinity of a nitride layer formed on the AlN layer can be improved. The nitride layer can be appropriately formed on the main substrate 110.

In FIG. 1A and FIG. 1B, for convenience of explanation, a thickness direction of the semiconductor substrate 1 is defined as a Z-axis direction, a direction (longitudinal direction) in which the opening portion 120 extends in the mask layer 12 is defined as a Y-axis direction, and a direction orthogonal to both the Z-axis direction and the Y-axis direction is defined as an X-axis direction. In FIG. 1A and FIG. 1B, the positive direction of each of the XYZ-axes is indicated by an arrow. In the following description of the present specification, the XYZ axes are similarly defined, and the XYZ axes are illustrated in the drawings.

The semiconductor substrate 1 according to the present embodiment includes a GaN-based semiconductor layer 20 formed by c-plane formation on a template substrate 10. In the GaN-based semiconductor layer 20, the direction in which the opening portion 120 extends (the Y direction in FIG. 1A and FIG. 1B) is the <1-100> direction of the GaN-based semiconductor layer 20 (GaN-based crystal), and the direction orthogonal to the direction in which the opening portion 120 extends (the X direction in FIG. 1A and FIG. 1B, a width direction of the opening portion 120) is the <11-20> direction of the GaN-based semiconductor layer 20. The thickness direction of the GaN-based semiconductor layer 20 is the <0001> direction of the GaN-based crystal. The <1-100> direction, the <11-20> direction, and the <0001> direction can also be expressed as the [1-100] direction, the [11-20] direction, and the [0001] direction, respectively.

The GaN-based semiconductor layer 20 of the semiconductor substrate 1 includes (i) a first portion S1 located on the mask portion 121 and (ii) a second portion S2 located on the opening portion 120. The first portion S1 can be regarded as a portion of the GaN-based semiconductor layer 20 overlapping with the mask portion 121 in plan view. The second portion S2 can be regarded as a portion of the GaN-based semiconductor layer 20 overlapping with the opening portion 120 in plan view. A view of the semiconductor substrate 1 in a direction parallel to the normal direction of the semiconductor substrate 1 can be referred to as "plan view".

In the second portion S2, the GaN-based semiconductor layer 20 has multiple threading dislocations D1 extending from the portion located in the opening portion 120 to the surface or the top layer of the GaN-based semiconductor layer 20. The threading dislocations D1 are a result of strain caused by, for example, a difference in lattice constant or thermal expansion coefficient between the main substrate 110 or the base substrate 11 and the GaN-based semiconductor layer 20. The threading dislocations D1 are dislocations linearly extending from the lower surface or the inside to an upper layer portion (top layer) of the GaN-based semiconductor layer 20 along the thickness direction of the GaN-based semiconductor layer 20. The threading dislocations D1 can be observed by performing cathode luminescence (CL) measurement on the surface of the GaN-based semiconductor layer 20 as described below.

While the threading dislocations D1 are indicated by black circles in FIG. 1A, FIG. 1A is a schematic view, and thus the size, number, distribution, and the like of the threading dislocations D1 are of course not limited to those indicated by the black circles in FIG. 1A.

The GaN-based semiconductor layer 20 has a low-dislocation region AR1 in the surface of the first portion S1. The low-dislocation region AR1 includes threading dislocations D1 with a dislocation density of, for example, $5\times10^6/cm^2$ or less in a CL image obtained by CL measurement. Such a low-dislocation region AR1 can be suitably used as an active region for a semiconductor device. The dislocation density can be expressed in units of [quantity/$cm^2$], and, in the present specification, may be expressed as [/$cm^2$] with the quantity omitted. In the present specification, the dislocation density of the threading dislocations D1 may be referred to as "threading dislocation density".

In the semiconductor substrate 1 according to the present embodiment, the first portion S1 includes the threading dislocations D1, and the threading dislocation density in the surface of the first portion S1 may be $5\times10^6/cm^2$ or lower, or may be $1\times10^6/cm^2$ or lower.

The threading dislocation density of the low-dislocation region AR1 may be 1/500 of that of the second portion S2, for example. The low-dislocation region AR1 may be a region in the surface of the first portion S1 in which the dislocation density of the threading dislocations D1 is so low that no threading dislocations D1 can be detected (confirmed) in the CL image.

The low-dislocation region AR1 indicated by a broken line in FIG. 1A is an example, and the position and size of the low-dislocation region AR1 are not limited to this example. The low-dislocation region AR1 may further extend in the X-axis direction or the Y-axis direction so as to extend to a region not illustrated in FIG. 1A.

The cross section in FIG. 1B is a cross section of the semiconductor substrate 1 according to the present embodiment taken along the thickness direction. This cross section is a plane having in-plane directions including the X-axis direction (<11-20> direction of the GaN-based semiconductor layer 20) and the Z-axis direction (<0001> direction of the GaN-based semiconductor layer 20). This cross section can be regarded as a cross section of the semiconductor substrate 1 taken along a plane (that is, the m-plane of the GaN-based semiconductor layer 20) orthogonal to the Y-axis direction (<1-100> direction of the GaN-based semiconductor layer 20), and thus may be referred to as an m-plane cross section in the following description of the present specification.

The following was found as a result of a detailed examination of the m-plane cross section described above through CL measurement. The GaN-based semiconductor layer 20 of the semiconductor substrate 1 has, in the first portion S1, non-threading dislocations D2 different from the threading dislocations D1 described above. The non-threading dislocations D2 are dislocations observed by CL measurement on a cross section taken along a plane parallel to the c axis (a plane parallel to the thickness direction), and are mainly basal plane (c plane) dislocations. The plane parallel to the c axis may be a plane parallel to the (1-100) plane (a plane whose normal is in the Y direction) or may be a plane parallel to the (11-20) plane (a plane whose normal is in the X direction). To be more specific, the non-threading dislocations D2 are dislocations different from the threading dislocations D1 and are dislocations that do not linearly extend to the top layer in the GaN-based semiconductor layer 20 from the lower surface or the inside. The non-threading dislocations D2 may be dislocations measurable in a CL image obtained through observation of the m-plane cross section described above using a CL-method, as described below. Therefore, the non-threading dislocations D2 can also be expressed as "measurable dislocations" that appear to be measurable in the m-plane cross section described above, and can also be expressed as "dislocations of interest" in the semiconductor substrate 1 of the present disclosure. In the present specification, the dislocation density of the non-threading dislocations D2 may be referred to as "non-threading dislocation density".

The non-threading dislocations D2 may include basal plane dislocations. In the GaN-based semiconductor layer 20, the basal plane is the c plane, and the basal plane dislocations may be defects with the propagation direction of the dislocations being in the basal plane (c plane). In the present disclosure, the non-threading dislocations D2 are dislocations that do not extend to (are not exposed on) the surface of the GaN-based semiconductor layer 20. Thus, the non-threading dislocations D2 in the first portion S1 are less likely to adversely affect the performance of the semiconductor device formed on the surface of the GaN-based semiconductor layer 20.

While the non-threading dislocations D2 are indicated by white circles in FIG. 1B, FIG. 1B is a schematic view, and the size, number, distribution, and the like of the non-threading dislocations D2 are of course not limited to those indicated by the white circles in FIG. 1B.

Figure 2A:
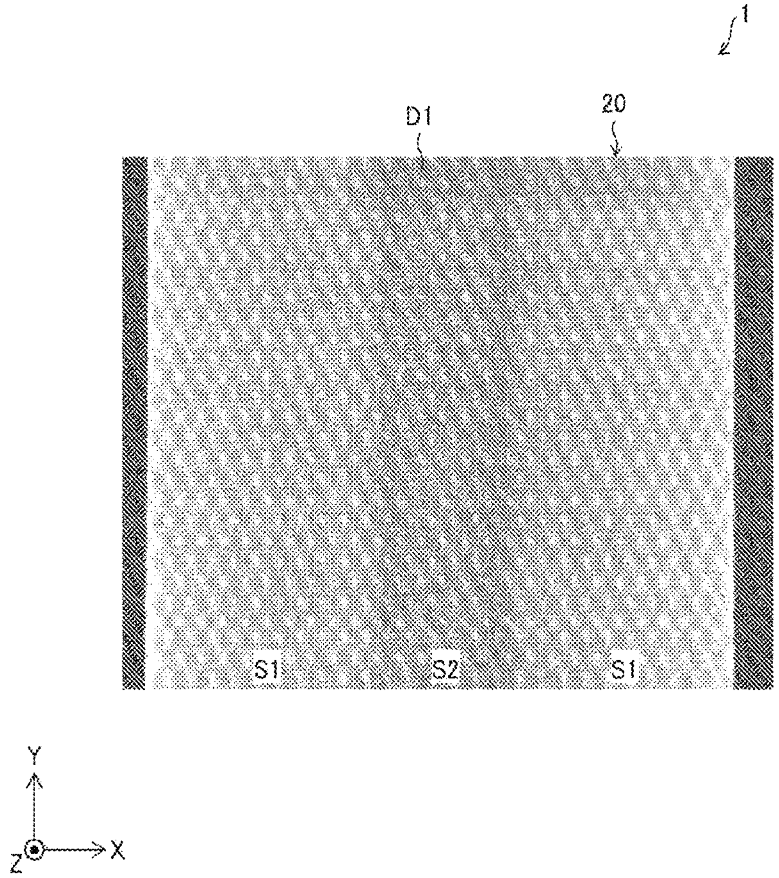
FIG. 2A is a photograph showing an example of a CL image obtained by CL measurement on a surface of the semiconductor substrate according to the first embodiment of the present disclosure.
Figure 2B:
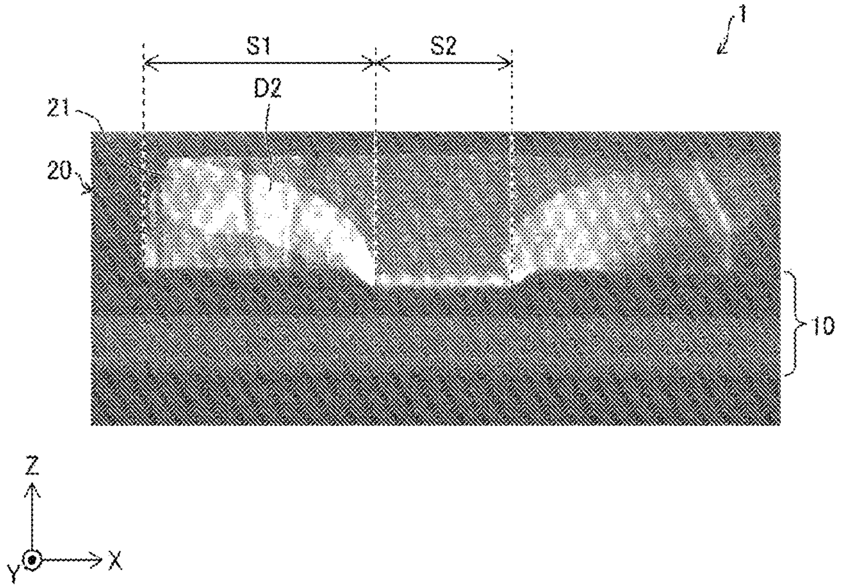
FIG. 2B is a photograph showing an example of a CL image obtained by CL measurement on an m-plane cross section of the semiconductor substrate in FIG. 2A.

FIG. 2 shows CL images of an example of the semiconductor substrate 1. FIG. 2A is a photograph showing an example of a CL image obtained by CL measurement of the surface of the semiconductor substrate 1. FIG. 2B is a photograph showing an example of a CL image obtained by the CL measurement of the m-plane cross section of the semiconductor substrate 1. Such a CL image is obtained by, for example, exposing a cross section of the semiconductor substrate 1 by using a method such as cleaving or gas phase etching, irradiating the cross section with an electron beam to excite various substances, and measuring light emission from the cross section.

As illustrated in FIG. 2A, multiple dark spots are observed in the surface of the second portion S2 (upper surface of the GaN-based semiconductor layer 20) in the CL image. Specifically, as illustrated in FIG. 2A, the semiconductor substrate 1 has multiple dislocations (threading dislocations D1) exposed on the surface of the second portion S2 of the GaN-based semiconductor layer 20. On the other hand, the semiconductor substrate 1 has almost no threading dislocations D1 in the surface of the first portion S1 of the GaN-based semiconductor layer 20 (no threading dislocations D1 can be observed on the surface of the first portion S1).

As illustrated in FIG. 2B, dark spots are also observed inside the first portion S1 (inside the GaN-based semiconductor layer 20). Such dark spots observed in the CL image are known to indicate dislocations. Specifically, the semiconductor substrate 1 has multiple non-threading dislocations D2 inside the first portion S1 of the GaN-based semiconductor layer 20. In the CL image of the m-plane cross section described above, a plurality of regions with different contrasts are observed in the first portion S1. Generally, brightness is high in part of the CL image where the impurity concentration is relatively high. Thus, the plurality of regions with different contrasts appear due to a difference in the concentration of impurities taken in when the GaN-based semiconductor layer 20 grows. Such contrasts may be observed also when impurities such as Si are taken in.

In the CL image of the m-plane cross section described above, one threading dislocation D1 may be entirely or partially observed. For example, part of the threading dislocation D1 extending obliquely across a portion in the GaN-based semiconductor layer 20, before the m-plane cross section described above is formed, corresponding to the m-plane cross section described above, is observed to be partially extending linearly on the CL image of the m-plane cross section described above.

Dislocation Density

In the present disclosure, the dislocation density in the upper surface of the GaN-based semiconductor layer 20 is the density of measurable dislocations (typically, threading dislocations D1) in the top layer of the GaN-based semiconductor layer 20 observed in the CL image as dark spots on the upper surface of the GaN-based semiconductor layer 20 (for example, the CL image as illustrated in FIG. 2A). Since the inside is slightly transparent in the CL image, the top layer described above may include the surface and a portion near the surface (for example, a portion with a depth that is 10% of the thickness of the GaN-based semiconductor layer 20 from the surface).

For example, in the first portion S1, the dislocation density on the upper surface of the GaN-based semiconductor layer 20 is calculated as follows. Specifically, a value is obtained by dividing the number of threading dislocations D1 detected in a predetermined area of the first portion S1 in the upper surface of the GaN-based semiconductor layer 20 (for example, an area of 25 $\mu m^2$ or more) by the predetermined area of the first portion S1 in the surface. Similarly, in the second portion S2, a value is obtained by dividing the number of threading dislocations D1 detected in a predetermined area of the upper surface of the GaN-based semiconductor layer 20 (for example, an area of 10 $\mu m^2$ or more) by the predetermined area of the second portion S2 in the surface.

In the present disclosure, the dislocation density in the m-plane cross section described above of the GaN-based semiconductor layer 20 is a density of measurable dislocations (non-threading dislocations D2) observed as dark spots on the m-plane cross section described above of the GaN-based semiconductor layer 20 in the CL image.

For example, in the first portion S1, the dislocation density in the m-plane cross section described above of the GaN-based semiconductor layer 20 is calculated as follows. Specifically, a value is obtained by dividing the number of non-threading dislocations D2 detected in a predetermined area of the first portion S1 on the m-plane cross section described above of the GaN-based semiconductor layer 20 (for example, an area of 30 $\mu m^2$ or more) by the predetermined area of the first portion S1 on the plane. Also in the second portion S2, a value is obtained by dividing the number of non-threading dislocations D2 detected in a predetermined area of the m-plane cross section described above of the GaN-based semiconductor layer 20 (for example, an area of 3 $\mu m^2$ or more) by the predetermined area of the second portion S2 on the plane.

In the following description of the present specification, the dislocation density of a certain portion may be calculated in a manner similar to that described above.

The relationship between the dislocation densities in the first portion S1 and the second portion S2 in the GaN-based semiconductor layer 20 will be described in detail below.

Semiconductor Substrate

Figure 3:
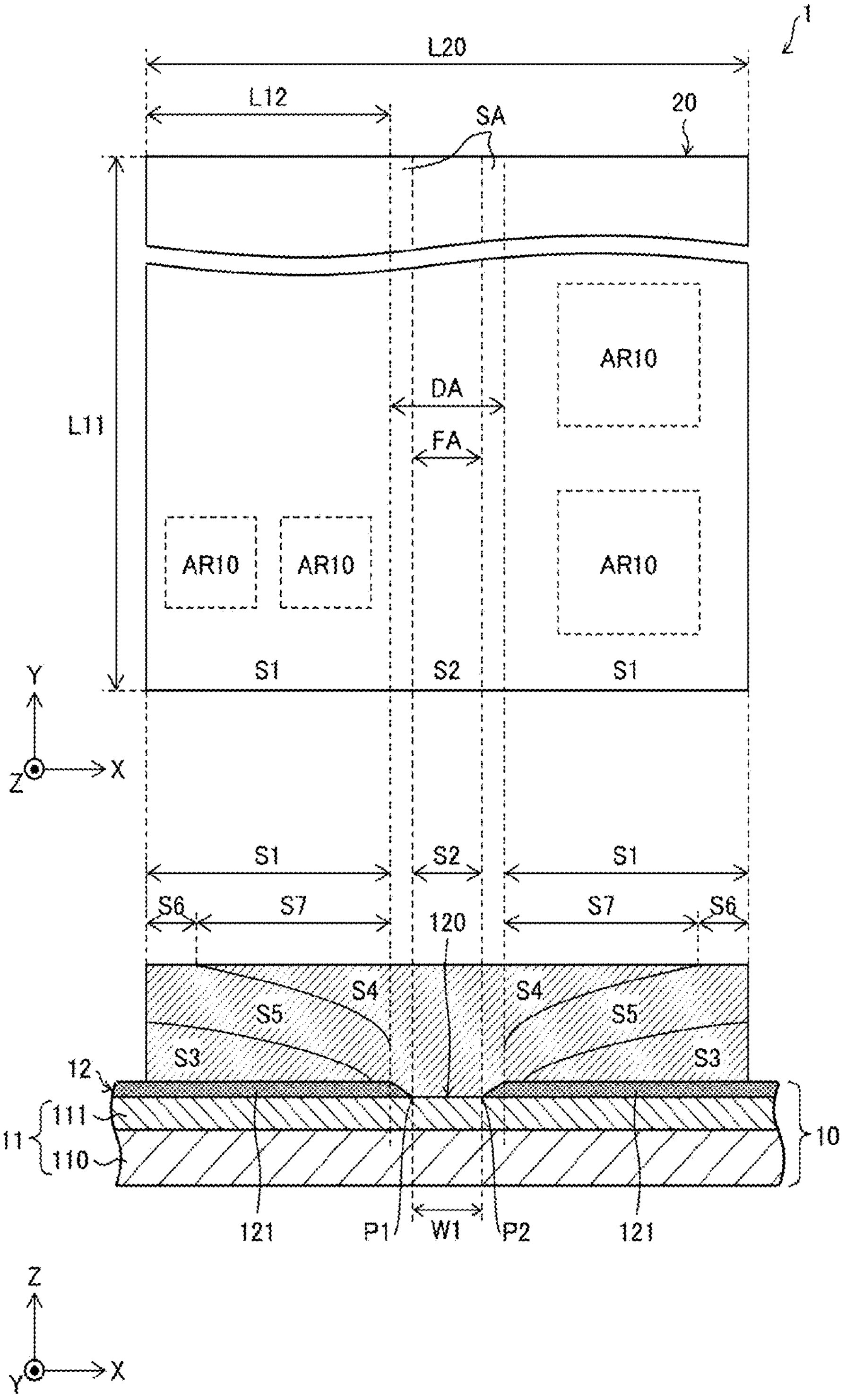
FIG. 3 is a schematic view illustrating the semiconductor substrate according to the first embodiment of the present disclosure.

The semiconductor substrate 1 according to the present embodiment will be described below with reference to FIG. 3. FIG. 3 is a schematic view illustrating the semiconductor substrate 1 according to the present embodiment. FIG. 3 is a schematic plan view of the semiconductor substrate 1 with the GaN-based semiconductor layer 20 viewed in the Z-axis direction from the positive side to the negative side (plan view of the semiconductor substrate 1), and a schematic cross-sectional view of the semiconductor substrate 1 taken along a plane orthogonal to the Y-axis direction (illustrating the m-plane cross section described above).

Base Substrate

The base substrate 11 in the semiconductor substrate 1 includes the main substrate 110 and a foundation layer 111.

Main Substrate

As described above, the main substrate 110 may be a substrate (heterogeneous substrate) made of a material different from that of the GaN-based semiconductor. Examples of the heterogeneous substrate described above include, but are not limited to, a sapphire ($Al_2O_3$) substrate, a silicon (Si) substrate, a silicon carbide (SiC) substrate, and a $ScAlMgO_4$ substrate. The heterogeneous substrate may be a substrate made of a material different from that of the GaN-based semiconductor, or may be a substrate having a lattice constant different from that of the GaN-based semiconductor.

The main substrate 110 may be a monocrystalline substrate made of any of various materials. The plane orientation of the main substrate 110 may be as follows depending on the material. For example, the plane orientation of the main substrate 110 may be the (111) plane when the material is Si, may be the (0001) plane (c plane) when the material is $Al_2O_3$, and may be the (0001) plane of 6H—SiC when the material is SiC.

The shape, material, and plane orientation of the main substrate 110 are not particularly limited as long as the GaN-based semiconductor layer 20 can be formed by the ELO method in a state where the foundation layer 111 has been formed (a state where the base substrate 11 has been formed). Still, for the sake of suitable formation of the GaN-based semiconductor layer 20, the GaN-based semiconductor layer 20 may be basically formed by performing c plane (basal plane) film formation with the surface of the base substrate 11 being the starting point. Therefore, the main substrate 110 may be a substrate that can serve as a starting point for growing the GaN-based semiconductor layer 20 in the (0001) plane orientation by the ELO method in a state where the foundation layer 111 has been formed (a state where the base substrate 11 has been formed).

The main substrate 110 may be a substrate made of a GaN-based semiconductor material (a GaN substrate for example). Examples of the GaN-based semiconductor include GaN, AlGaN, AlGaInN, and InGaN. As the GaN-based semiconductor, a material not containing Ga, such as AlN, AlInN, or InN, may be used.

Foundation Layer

The foundation layer 111 in the base substrate 11 includes a thin film including GaN or a GaN-based semiconductor (hereinafter, may be referred to as a GaN-based thin film). The GaN-based thin film described above is formed to correspond to the GaN-based semiconductor layer 20. Specifically, the composition of the GaN-based thin film described above may correspond to the composition of the GaN-based semiconductor layer 20. This is because the GaN-based thin film described above serves as a starting point for the growth of the GaN-based semiconductor layer 20 when the GaN-based semiconductor layer 20 is formed. Therefore, the foundation layer 111 may be positioned so as to at least overlap with the opening portion 120 of the mask layer 12. The foundation layer 111 is exposed through the opening portion 120 of the mask layer 12, before the GaN-based semiconductor layer 20 is formed. The GaN-based thin film described above included in the foundation layer 111 may be exposed through the opening portion 120 of the mask layer 12.

The GaN-based semiconductor included in the foundation layer 111 includes any of AlGaN, AlGaInN, and InGaN. Note that the material of the GaN-based semiconductor is not limited to the aforementioned.

The foundation layer 111 may include an aluminum nitride (AlN) layer or an AlInN layer. The AlN layer may have, for example, a thickness of from about 10 nm to about 5 μm.

When the main substrate 110 is made of a material containing Si, the foundation layer 111 may include the AlN layer. By providing the foundation layer 111 including the AlN layer, the main substrate 110 and the GaN-based semiconductor layer 20 can be separated from each other by the AlN layer. Therefore, for example, when the GaN-based semiconductor layer 20 is formed in a later step, the occurrence of a phenomenon in which Si contained in the main substrate 110 and GaN of the GaN-based semiconductor layer 20 melt each other (meltback) can be suppressed.

The foundation layer 111 may be a multilayer film. The foundation layer 111 as a multilayer film may include the AlN layer. The multilayer film may be, for example, a multilayer film in which the Al composition gradually becomes closer to GaN, such as $Al_{0.7}Ga_{0.3}N$ layer/$Al_{0.3}Ga_{0.7}N$ layer. Such a multilayer film can be easily formed by metal organic chemical vapor deposition (MOCVD). When the foundation layer 111 is a multilayer film, stress generated in the GaN-based semiconductor layer 20 from the main substrate 110 (for example, a Si substrate) can be relaxed.

For example, a layered body of AlN layer/AlGaN layer/GaN layer is formed as the foundation layer 111 on a Si (111) substrate as the main substrate 110 by MOCVD. The AlGaN layer included in the foundation layer 111 may be a multilayer film, and the multilayer film may be a plurality of AlGaN layers in which the Al composition gradually decreases (closer to GaN) in the Z-axis positive direction.

The thickness of the foundation layer 111 may be 0.1 μm or more and 10.0 μm or less, or may be 0.2 μm or more and 6.0 μm or less. In the semiconductor substrate 1, the foundation layer 111 may be thicker than the mask portion 121 of the mask layer 12.

While the foundation layer 111 is illustrated as a single layer in FIG. 3, the foundation layer 111 may include a plurality of layers as described above. The foundation layer 111 may include a layer containing carbon.

As described above, in the semiconductor substrate 1 according to the present embodiment, the base substrate 11 includes the main substrate 110 and the foundation layer 111 that is located on the main substrate 110 to at least overlap with the opening portion 120 of the mask layer 12, and includes GaN or a GaN-based semiconductor. The GaN-based semiconductor layer 20 is in contact with the foundation layer 111. Thus, the GaN-based semiconductor layer 20 can be suitably grown from the foundation layer 111 overlapping with the opening portion 120. In the present embodiment, the foundation layer 111 is also located between the mask portion 121 of the mask layer 12 and the main substrate 110.

Mask Layer

The mask layer 12 in the semiconductor substrate 1 is a growth mask used in the ELO method for selectively growing the GaN-based semiconductor layer 20. The mask layer 12 has the mask portion 121 covering at least part of the base substrate 11 to make the GaN-based semiconductor layer 20 grow with a point on the base substrate 11 exposed through the opening portion 120 being the starting point. The mask layer 12 only needs to be formed as a layer above the base substrate 11, and thus the semiconductor substrate 1 may include another layer between the base substrate 11 and the mask layer 12.

The mask portion 121 of the mask layer 12 may be formed of, for example, an insulating film such as a silicon oxide film ($SiO_2$ for example), a titanium nitride film (such as TiN), a silicon nitride film (such as SiN), or a silicon oxynitride film (SiON for example). As the mask layer 12, a multilayer film including the films exemplified above may be used, and the multilayer film may include a film made of another material. As the mask layer 12, a metal film (noble metal, refractory metal, or the like) can also be used. The template substrate 10 is obtained by forming the mask layer 12 on the base substrate 11. In the present embodiment, the mask layer 12 is composed of a single layer of $SiO_2$.

A silicon nitride film (SiNx film) or a silicon oxynitride film (SiON film) may be used as the mask portion 121. As a result, the bonding strength between the mask layer 12 and the GaN-based semiconductor layer 20 can be made small compared with the case where the mask layer 12 is made of, for example, $SiO_2$ or the like, so that the GaN-based semiconductor layer 20 can be easily peeled from the mask portion 121 later.

In view of the above, the mask layer 12 may have a two-layer structure such as SiOx/SiNx or SiNx/SiOx between the foundation layer 111 and the GaN-based semiconductor layer 20.

The semiconductor substrate 1 may have a layer structure such as foundation layer 111/SiNx/SiOx/SiNx/GaN-based semiconductor layer 20, and the mask layer 12 may have a three-layer structure in which both sides of SiOx are sandwiched by SiNx. Of course, the mask layer 12 may be a single silicon nitride film. The mask layer 12 may have a structure having a SiNx film on the side in contact with the GaN-based semiconductor layer 20 for the purpose of facilitating peeling of the GaN-based semiconductor layer 20 from the mask portion 121.

Even when a silicon oxide film (SiOx film) generally used in the ELO method is used as the mask layer 12, the GaN-based semiconductor layer 20 can be easily peeled by optimizing the film formation conditions of the mask layer 12, the film formation conditions of the GaN-based semiconductor layer 20, and the like. These film formation conditions will be described below together with the description on the method for producing the semiconductor substrate 1.

As described above, the mask layer 12 may include, for example, silicon oxide, silicon nitride, silicon oxynitride, or titanium nitride. The semiconductor substrate 1 can be formed using the mask layer 12 made of the above-described material. Alternatively, nitride may be used for the mask layer 12.

The length of the mask layer 12 in the longitudinal direction may be 100 μm or more and 25 cm or less, for example. The length of the mask layer 12 in the longitudinal direction can be regarded as the length of the opening portion 120 in the longitudinal direction or the length of the mask portion 121 in the longitudinal direction. The thickness of the mask layer 12 (that is, the mask portion 121) may be 100 nm or more and 4 μm or less, or may be 150 nm or more and 2 μm or less.

The opening portion 120 of the mask layer 12 is a space sandwiched by side surfaces of two mask portions 121 that are adjacent to each other.

The opening portion 120 in the mask layer 12 has a slit shape extending in the <1-100> direction of the GaN-based semiconductor layer 20. The Y-axis direction in FIG. 3 is the <1-100> direction of the GaN-based semiconductor layer 20, and the X-axis direction is the <11-20> direction of the GaN-based semiconductor layer 20. Since the opening portion 120 has a slit shape, the GaN-based semiconductor layer 20 can be suitably grown on the template substrate 10 by the ELO method.

An opening width W1 of the opening portion 120 may be 0.1 μm or more and 30 μm or less, or may be 1 μm or more and 6 μm or less. A smaller opening width W1 leads to a smaller number of threading dislocations D1 propagating into the GaN-based semiconductor layer 20 from an initial growth layer formed in the surface of the opening portion 120. The GaN-based semiconductor layer 20 can be mechanically peeled easily from the template substrate 10.

The smaller the opening width W1, the larger the effective area of the low-dislocation region AR1 that is the active region in the GaN-based semiconductor layer 20. The active region is a portion of the surface of the GaN-based semiconductor layer 20 that overlaps with a region that emits light in the case of a light emitting element in plan view, and is generally a portion that overlaps with a region where a p-contact electrode is formed and current is injected into the device in plan view. Thus, an LED device with a large light emitting area can be obtained. The ridge stripe width can be increased, whereby a high-output laser device can be obtained.

In the semiconductor substrate 1 according to the present embodiment, the opening portion 120 has a shape in which the opening width on the base substrate 11 side is smaller than the opening width on the GaN-based semiconductor layer 20 side. The opening portion 120 may have a tapered shape in which the width gradually increases in the positive Z-axis direction (in other words, a shape in which the width decreases toward the foundation layer 111 side). In other words, side surfaces of the mask portion 121 in the X-axis direction may be inclined. In the semiconductor substrate 1, an acute angle may be formed by a side surface of the mask portion 121, in the X-axis direction, forming the opening portion 120 and the surface of the base substrate 11. In the semiconductor substrate 1, an obtuse angle may be formed by a side surface of the mask portion 121, in the X-axis direction, forming the opening portion 120 and a surface of the mask portion 121 farther from the base substrate 11. As a result, when the GaN-based semiconductor layer 20 is grown, the GaN-based semiconductor layer 20 can be smoothly grown laterally while smoothly growing over the mask portion 121, whereby improvement of the quality of the GaN-based semiconductor layer 20 can be facilitated.

When the opening portion 120 has a tapered shape, the opening width W1 of the opening portion 120 is a distance between two points (a point P1 and a point P2) defined as intersections between the inclined side surfaces of the two mask portions 121 forming the opening portion 120 and the upper surface of the base substrate 11 in the m-plane cross section described above.

GaN-Based Semiconductor Layer

In the semiconductor substrate 1 according to the present embodiment, basically, the GaN-based semiconductor layer 20 is formed by c plane (basal plane) formation, and specifically, is formed to grow in an island shape in the (0001) plane orientation. In this case, the GaN-based semiconductor layer 20 is selectively grown on the surface of the foundation layer 111 exposed through the opening portion 120, and then laterally grown on the mask portion 121. Thus, the GaN-based semiconductor layer 20 is grown on the mask portion 121.

The GaN-based semiconductor layer 20 is a layer including GaN or a GaN-based semiconductor. The GaN-based semiconductor layer 20 may be appropriately configured according to a semiconductor element, and may have at least one of conductivity types including n-type, i-type, and p-type.

Specific examples of the layer forming the GaN-based semiconductor layer 20 include a GaN layer, an AlGaN layer, an AlGaInN layer, and an InGaN layer. Thus, the GaN-based semiconductor included in the GaN-based semiconductor layer 20 includes AlGaN, AlGaInN, and InGaN. The layer that includes GaN or a GaN-based semiconductor, and serves as the GaN-based semiconductor layer 20 may be an undoped layer or a doped layer.

In the semiconductor substrate 1, the GaN-based semiconductor layer 20 may have a thickness of 0.5 μm or more and 25 μm or less, or may have a thickness of 1 μm or more and 10 μm or less. The thickness of the GaN-based semiconductor layer 20 may be the distance from the boundary between the mask portion 121 and the GaN-based semiconductor layer 20 to the surface of the GaN-based semiconductor layer 20 in the m-plane cross section described above. Depending on the application of a device produced using the semiconductor substrate 1, the GaN-based semiconductor layer 20 with a smaller thickness may be more effective. In the semiconductor substrate 1, the thickness of the GaN-based semiconductor layer 20 may be smaller than the opening width W1 of the opening portion 120. The thickness of the GaN-based semiconductor layer 20 may be smaller than the thickness of the mask layer 12.

The GaN-based semiconductor layer 20 may be a GaN layer from a viewpoint that a wide range of suitable ELO film formation conditions can be set. Alternatively, the GaN-based semiconductor layer 20 may be an InGaN layer. In order to form the InGaN layer in the lateral direction using ELO, the InGaN layer may be formed under a condition of a low temperature, for example, lower than 1000° C. When the GaN-based semiconductor layer 20 is an InGaN layer, the bonding strength with the mask layer 12 can be reduced. The InGaN layer may be a layer in which In is incorporated at an In composition level of 1% or more ($In_xGa_{1-x}N$:x>0.01), for example.

In a process of producing the semiconductor substrate 1 of the present embodiment, the GaN-based semiconductor layer 20 is formed with the non-threading dislocations D2 actively produced inside the first portion S1, as will be described in detail below. The GaN-based semiconductor layer 20 in the semiconductor substrate 1 of the present embodiment includes the first portion S1 and the second portion S2 with the dislocation density of the non-threading dislocations D2, in the m-plane cross section described above, being lower than that in the first portion S1 (see FIG. 2B).

In the GaN-based semiconductor layer 20, the dislocation density of the non-threading dislocations D2 in the first portion S1 is relatively high. The present inventors anticipate this to result in relaxation of the internal stress in the first portion, and reduction in the dislocation density of the threading dislocations D1 in the surface of the first portion S1 in a top view of the GaN-based semiconductor layer 20.

The threading dislocations D1 in the region of the surface of the GaN-based semiconductor layer 20 where the semiconductor device is to be formed impose adverse effects on the performance of the semiconductor device. In the process of producing the semiconductor substrate 1 of the present embodiment, the GaN-based semiconductor layer 20 is grown to have a higher dislocation density of the non-threading dislocations D2 in the first portion S1 than in the second portion S2. With this process, even when the GaN-based semiconductor layer 20 is formed on the mask layer 12 having a wide area, the dislocation density of the threading dislocations D1 can be reduced over a wide region of the first portion S1. Thus, the semiconductor substrate 1 can ensure a large area of the high-quality low-dislocation region AR1 (see FIG. 1) where the device can be formed on the surface of the GaN-based semiconductor layer 20. As a result, the semiconductor substrate 1 can be provided that enables a high-quality semiconductor device to be produced. As described above, in the semiconductor substrate 1, the dislocation density of the non-threading dislocations D2 in the cross section (the m-plane cross section for example) of the GaN-based semiconductor layer 20 taken along the thickness direction is higher in the first portion S1 than in the second portion S2. The surface of the first portion S1 includes the low-dislocation region AR1 (electronic component forming region described below). Thus, the dislocation density of the threading dislocations D1 on the surface of the first portion S1 can be reduced, and the quality of the GaN-based semiconductor layer 20 can be improved.

In the first portion S1 of the GaN-based semiconductor layer 20, the dislocation density (threading dislocation density) in the upper surface of the GaN-based semiconductor layer 20 may be lower than the dislocation density (dislocation density of the non-threading dislocations D2) in a cross section (for example, the m-plane cross section described above) of the GaN-based semiconductor layer 20 taken along the thickness direction.

With the dislocation density in the surface of the first portion S1 thus made low in the semiconductor substrate 1, the crystallinity, characteristics, and reliability of the semiconductor device formed on the GaN-based semiconductor layer 20 can be improved.

For example, in the semiconductor substrate 1, the non-threading dislocation density in the first portion S1 may be $5\times10^8/cm^2$ or lower, and may be $1\times10^7/cm^2$ or higher and $8\times10^8/cm^2$ or lower in a cross section (for example, the m-plane cross section described above) of the GaN-based semiconductor layer 20 taken along the thickness direction.

In the semiconductor substrate 1, the surface of the first portion S1 of the GaN-based semiconductor layer 20 may have a dislocation density (dislocation density of the non-threading dislocations D2) of $5\times10^6/cm^2$ or lower. In the surface of the GaN-based semiconductor layer 20, the first portion S1 may be a region of 15 μm×15 μm or more overlapping with the mask portion 121 in plan view.

In the semiconductor substrate 1, the opening portion 120 may have a shape with a longitudinal direction, and in the first portion S1, the opening portion 120 may have a size of 100 μm or more in the longitudinal direction (Y-axis direction) in plan view. A length L11 of the first portion S1 from one end portion to the other end portion in the Y-axis direction may be 100 μm or more and 25 cm or less.

As described above, the semiconductor substrate 1 can ensure a large area of a region in the surface of the GaN-based semiconductor layer 20 where a high-quality semiconductor device can be produced.

In the semiconductor substrate 1, a length L12 of the first portion S1 from one end portion to the other end portion in the X-axis direction may be 10 μm or more and 80 μm or less. The length L12 described above may be, for example, a distance between (i) a position of an end portion (end surface) of the first portion S1 farther from the opening portion 120 and (ii) a position of a side surface of the mask portion 121 on the opening portion 120 side in the X-axis direction of the m-plane cross section described above. When the side surface of the mask portion 121 on the opening portion 120 side is tapered, (ii) described above may be a position of an end portion of the side surface farther from the base substrate 11.

In the semiconductor substrate 1 according to the present embodiment, the threading dislocations in the second portion S2 of the GaN-based semiconductor layer 20 may extend from the opening portion 120 to the surface of the GaN-based semiconductor layer 20. Thus, in the second portion S2, the dislocation density (dislocation density of the threading dislocations D1) on the upper surface of the GaN-based semiconductor layer 20 may be higher than the dislocation density (dislocation density of the non-threading dislocations D2) in a cross section of the GaN-based semiconductor layer 20 taken along the thickness direction.

In the semiconductor substrate 1, the dislocation density of the threading dislocations D1 may be higher in the second portion S2 than in the first portion S1. In the semiconductor substrate 1, the threading dislocations D1 extend from the opening portion 120 toward the top layer of the GaN-based semiconductor layer 20, in the GaN-based semiconductor layer 20 formed by the ELO method. Thereby, extension of the threading dislocations D1 toward the first portion S1 can be suppressed. As a result, the dislocation density of the threading dislocations D1 in the surface of the first portion S1 can be made small.

In the semiconductor substrate 1, the GaN-based semiconductor layer 20 may include the plurality of threading dislocations D1 that penetrate through the GaN-based semiconductor layer 20 in the thickness direction in a cross section (for example, the m-plane cross section described above) of the GaN-based semiconductor layer 20 taken along the thickness direction, and all of the plurality of threading dislocations D1 may be formed to pass through the opening portion 120.

In the semiconductor substrate 1, the density of the non-threading dislocations D2 occurring near the upper surface of the GaN-based semiconductor layer 20 may be reduced by controlling, for example, the film formation conditions or the dimensions of the mask layer 12, and the like. In the semiconductor substrate 1 according to the present embodiment, the first portion S1 of the GaN-based semiconductor layer 20 includes a third portion S3 located on the mask portion 121 (on the side close to the mask portion 121) and a fourth portion S4 that is located closer to the surface of the GaN-based semiconductor layer 20 than the third portion S3 is and has a lower dislocation density than the third portion S3. With the configuration described above, the dislocation density in the surface of the first portion S1 can be further reduced.

As described above, in the CL image of the m-plane cross section, a plurality of regions with different contrasts may be observed in the first portion S1 in the semiconductor substrate 1. Such a difference in contrast is caused by a difference in impurity concentration. The difference in contrast may be observed in a high-resolution CL image obtained by CL measurement using a relatively low-speed electron beam with an acceleration voltage of 1 to 5 kV. In the semiconductor substrate 1 according to the present embodiment, the first portion S1 can be formed to include a plurality of portions having different impurity concentrations by forming the GaN-based semiconductor layer 20 under appropriately controlled film formation conditions.

In the present specification, the impurities of the GaN-based semiconductor layer 20 may be oxygen and Si. Silicon and oxygen taken into the GaN-based semiconductor layer 20 may serve as an n-type dopant. The impurity concentrations of oxygen and Si in the GaN-based semiconductor layer 20 can be controlled, for example, as follows. For example, when $SiO_2$ is used for the mask layer 12, oxygen and Si can be diffused from $SiO_2$ into the GaN-based semiconductor layer 20 and the diffusion amount of oxygen and Si can be controlled by adjusting the temperature or the film formation rate during the film formation of the GaN-based semiconductor layer 20.

The impurity concentration in the GaN-based semiconductor layer 20 (unit is, for example, atom/$cm^3$) can be quantitatively measured by analyzing the GaN-based semiconductor layer 20 in the Z-axis direction (thickness direction) using, for example, secondary ion mass spectrometry (SIMS).

In the semiconductor substrate 1 according to the present embodiment, the impurity concentration of the first portion S1 may be higher than the impurity concentration of the second portion S2 in a cross section (for example, the m-plane cross section described above) of the GaN-based semiconductor layer 20 taken along the thickness direction.

In the semiconductor substrate 1 according to the present embodiment, the first portion S1 of the GaN-based semiconductor layer 20 may include the third portion S3 located on the mask portion 121 and the fourth portion S4 that is located closer to the surface of the GaN-based semiconductor layer 20 than the third portion S3 is and has a lower impurity concentration than the third portion S3. Thus, the impurity concentration in the surface of the first portion S1 can be reduced. Thus, the quality of the GaN-based semiconductor layer 20 can be improved, and the semiconductor substrate 1 enabling production of a high-quality semiconductor device can be obtained.

In the semiconductor substrate 1 according to the present embodiment, the first portion S1 of the GaN-based semiconductor layer 20 may include a fifth portion S5 that is located between the third portion S3 and the fourth portion S4 in the thickness direction of the GaN-based semiconductor layer 20, and has a higher impurity concentration than the third portion S3.

In the semiconductor substrate 1, the GaN-based semiconductor layer 20 may include an inclined facet portion 21 in a side surface portion in the X-axis direction (see FIG. 1B and FIG. 2B). The inclined facet portion 21 may be, for example, the (11-22) plane of the GaN-based semiconductor layer 20, and may correspond to the end surface of the fifth portion S5. When the GaN-based semiconductor layer 20 is formed to include the inclined facet portion 21, the fifth portion S5 may be a portion of the GaN-based semiconductor layer 20 grown while including the inclined facet portion 21. A relatively large amount of impurity may be incorporated into the fifth portion S5 grown in this manner. For example, the GaN-based semiconductor layer 20 can be formed to include the inclined facet portion 21 by controlling a ratio of the group V material to the group III material.

The inclined facet portion 21 may be, for example, a (11-2β) plane (β is an integer) in the GaN-based semiconductor layer 20. With the GaN-based semiconductor layer 20 formed to include such an inclined facet portion 21, formation of the GaN-based semiconductor layer 20 including the third portion S3, the fourth portion S4, and the fifth portion S5 described above can be facilitated.

In the semiconductor substrate 1 according to the present embodiment, the first portion S1 may include a sixth portion S6 and a seventh portion S7 that is located closer to the second portion S2 than the sixth portion S6 is, and has a lower impurity concentration than the sixth portion S6, in the surface of the first portion S1 of the GaN-based semiconductor layer 20.

In the side surface portion of the GaN-based semiconductor layer 20, the impurities evaporated from the mask portion 121 are likely to be taken into the GaN-based semiconductor layer 20. Thus, the sixth portion S6 has a higher impurity concentration than the seventh portion S7. The seventh portion S7 can be suitably used as a region where a high-quality semiconductor device can be produced.

The GaN-based semiconductor layer 20 includes an electronic component forming region AR10 overlapping with the first portion S1 only. The electronic component forming region AR10 in the semiconductor substrate 1 can be ensured to have a large area and has a low dislocation density, whereby a device can be suitably formed.

In the semiconductor substrate 1, the opening portion 120 has a shape with a longitudinal direction, and the GaN-based semiconductor layer 20 may include a plurality of electronic component forming regions AR10, each overlapping with the first portion S1, arranged along the longitudinal direction of the opening portion 120. With the configuration described above, a plurality of electronic components can be formed by using the semiconductor substrate 1. Thus, the electronic components can be mass produced easily.

In the semiconductor substrate 1, the GaN-based semiconductor layer 20 may include the plurality of electronic component forming regions AR10 each overlapping with the first portion S1, along a direction crossing the longitudinal direction of the opening portion 120. With the configuration described above, a larger number of electronic components can be formed using the semiconductor substrate 1.

The semiconductor substrate 1 further includes a dislocation region DA including dislocations located in the surface of the GaN-based semiconductor layer 20. A difference region SA obtained by subtracting a surface region FA of the second portion S2 from the dislocation region DA may be smaller than the surface region FA of the second portion S2. A smaller surface region FA of the second portion S2 corresponding to the opening portion 120 through which the foundation layer 111 is exposed leads to a larger electronic component forming region AR10. For example, with a smaller width of the mask portion 121 and a shorter interval between the mask portion 121 and the opening portion 120, a larger number of devices (semiconductor devices) can be obtained from one wafer. On the other hand, with the difference region SA designed to be smaller, a large area of the electronic component forming region AR10 can be easily ensured, even when the interval described above is short. As a result, a device having a relatively large size can be easily produced.

In the semiconductor substrate 1, the width of the dislocation region DA may be larger than the width of the surface region FA of the second portion S2, and can be 1.3 times the width of the surface region FA of the second portion S2 or less. By reducing the width of the dislocation region DA expanding from the surface region FA, a larger electronic component forming region AR10 can be effectively obtained. With the electronic component forming region AR10 of a large area obtained, a light emitting element of a higher output can be formed, and an electronic element enabling control of a larger amount of power can be formed. For example, in the case of a light emitting element, a light emitting region may be formed in the electronic component forming region AR10.

A difference between opening widths of the opening portion 120 on the base substrate 11 side and the GaN-based semiconductor layer 20 side may be smaller than the thickness of the mask portion 121. As a result, a large area of the GaN-based semiconductor layer 20 grown on the mask portion 121 can be ensured.

On the other hand, the difference between the opening widths of the opening portion 120 on the base substrate 11 side and the GaN-based semiconductor layer 20 side may be larger than the thickness of the mask portion 121. As a result, improvement in the quality of the GaN-based semiconductor layer 20 grown on the mask portion 121 from the opening portion 120 can be facilitated.

The semiconductor substrate 1 may have a monocrystalline Si substrate as the main substrate 110 of the base substrate 11. Thus, the semiconductor substrate 1 can be formed by using an inexpensive Si substrate, which is a heterogeneous substrate, as the main substrate 110. Thus, the cost for producing the semiconductor device can be largely reduced.

Generally, the ELO method is often used for forming the GaN-based semiconductor layer on an expensive substrate such as a GaN substrate or a sapphire substrate. However, when such an expensive substrate is used, the reduction in the production cost is limited. For example, the price of a micro LED display is highly dependent on the cost for producing the micro LED chip. For example, a 4K size micro LED display requires 24,000,000 LED chips.

When the semiconductor substrate 1 is used, the cost for producing the micro LED chips can be largely reduced compared with a case where the micro LED chips are produced using a GaN-based semiconductor layer formed on a GaN substrate or a sapphire substrate.

Method for Producing Semiconductor Substrate

An example of a method for producing the semiconductor substrate 1 will be described.

First of all, the base substrate 11 including the main substrate 110 and the foundation layer 111 is prepared (step of preparing the base substrate). When the foundation layer 111 includes an AlN layer, the method for forming the AlN layer is not limited to MOCVD, and sputtering or the like may be used. When a sputtering device is used, there is an advantage in that the template substrate 10 can be produced at a low cost and the like.

The method for forming the foundation layer 111 is not particularly limited, and the foundation layer 111 may be formed on the main substrate 110 using a known method as appropriate.

For example, a layered body of AlN layer/$Al_{0.6}Ga_{0.4}N$ layer/GaN layer is formed as the foundation layer 111 on the main substrate 110 by MOCVD. In a specific example of the foundation layer 111, the AlN layer may be 30 nm thick, the $Al_{0.6}Ga_{0.4}N$ layer may be 300 nm thick, and the GaN layer may be from 1 to 2 μm thick.

Next, in the method for producing the semiconductor substrate 1 according to the present embodiment, the mask layer 12 including the opening portion 120 and the mask portion 121 is formed on the base substrate 11 (step of forming the mask layer).

In the step of forming the mask layer, first, for example, an insulating film (for example, a film in which a $SiO_2$ film and a SiN film are layered) is formed on the foundation layer 111 by plasma chemical vapor deposition (CVD), sputtering, or the like. Then, a resist is applied and patterned using, for example, photolithography. Thus, a resist having stripe-shaped opening portions is formed. Next, for example, the SiNx film and the SiOx film are partially removed using a wet etchant such as hydrofluoric acid (HF) or buffered hydrofluoric acid (BHF), and then organic cleaning is performed to remove the resist. Thus, the template substrate 10 in which the mask layer 12 is formed on the base substrate 11 can be obtained.

In a specific example of the template substrate 10, in the mask layer 12, the $SiO_2$ film is, for example, 0.3 μm thick, and the SiN film on the $SiO_2$ film is, for example, 70 nm thick. The opening width W1 is 5 μm. In the mask layer 12, the material and the layer structure of the mask portion 121 may be selected in accordance with the type (component composition) of the GaN-based semiconductor layer 20.

Pinholes may be present in the mask portion 121. Therefore, after film formation is performed once in a film formation device, organic cleaning or the like may be performed, and then the film may be introduced into the film formation apparatus again to form the same kind of film. As a result, pinholes in the mask layer 12 can be reduced.

The template substrate 10 provided with the mask layer 12 including the opening portion 120 and the mask portion 121 is prepared in the manner described above (step of preparing the template substrate). Next, in the method for producing the semiconductor substrate 1 according to the present embodiment, the GaN-based semiconductor layer 20 including GaN or a GaN-based semiconductor is formed over the base substrate 11 exposed through the opening portion 120 and over the mask portion 121 (step of forming the semiconductor layer).

In the step of forming the semiconductor layer, the GaN-based semiconductor layer 20 is formed to include the first portion S1 located on the mask portion 121 and the second portion S2 located on the opening portion 120. For example, the template substrate 10 is loaded into an MOCVD device, to form the GaN-based semiconductor layer 20. For example, when the main substrate 110 is a Si substrate, the foundation layer 111 is a superlattice layer structure 40 pair of an AlN layer and $Al_{0.2}Ga_{0.8}N$/$Al_{0.8}Ga_{0.2}N$, and the mask layer 12 is a SiOx film, the GaN-based semiconductor layer 20 may be grown under the film formation conditions that are a substrate temperature of 1120° C., a growth pressure of 50 kPa, trimethylgallium (TMG) of 22 sccm, $NH_3$ of 15 slm, and V/III=6000 (the ratio of the supply amount of the group V material to the supply amount of the group III material).

Specifically, in the step of forming the semiconductor layer, preferably, an initial growth layer (seed growth layer) is first formed in the opening portion 120 of the mask layer 12, and then the GaN-based semiconductor layer 20 is laterally grown from the initial growth layer. The initial growth layer is a growth layer serving as a starting point (seed) when the GaN-based semiconductor layer 20 is laterally grown on the mask portion 121. The formation of the initial growth layer may be stopped immediately before the end of the initial growth layer grows onto the upper surface of the mask portion 121 (in the middle of the portion (side surface) having the tapered shape of the mask portion 121) or immediately after the end of the initial growth layer grows onto the upper surface of the mask portion 121. As a result, the GaN-based semiconductor layer 20 can quickly grow in the lateral direction. The initial growth layer may be formed to have a height of, for example, 2.0 μm or more and 3.0 μm or less.

By laterally growing the GaN-based semiconductor layer 20 after forming the initial growth layer as described above, the non-threading dislocations D2 inside the first portion S1 can be increased (the dislocation density of the threading dislocations D1 in the surface can be reduced). The distribution of the impurity concentrations inside the first portion S1 can be controlled (the third portion S3 to the fifth portion S5 can be formed). The GaN-based semiconductor layer 20 can be grown in the Z-axis direction or in the X-axis direction by appropriately controlling the conditions during film formation.

With the above process, the semiconductor substrate 1 in which the GaN-based semiconductor layer 20 is formed on the template substrate 10 is obtained.

In a specific example of the GaN-based semiconductor layer 20, a lateral width L20 (illustrated in FIG. 3) is 53 μm. When the opening width W1 is 5 μm, the effective width (length L12) of the first portion S1 where a device can be formed is 24 μm. The thickness from the surface of the mask portion 121 to the surface of the GaN-based semiconductor layer 20 in the thickness direction of the GaN-based semiconductor layer 20 is 6 μm. The aspect ratio of the GaN-based semiconductor layer 20 is 24 μm/6 μm=4.0, which is high.

With the ELO method, a high lateral film formation rate can be achieved by extending the diffusion length of Ga atoms. In the method for producing the semiconductor substrate 1 according to the present embodiment, the film formation temperature in the step of forming the semiconductor layer may be 900° C. or higher and 1180° C. or lower. The film formation temperature in the step of forming the semiconductor layer may be a relatively low temperature that is 1000° C. or lower.

When the film formation temperature in the step of forming the semiconductor layer is set to a relatively low temperature of 1000° C. or lower, triethylgallium (TEG) may be used as the Ga source gas. With the TEG, the organic raw material is efficiently decomposed at a low temperature. Therefore, a high lateral film formation rate of the GaN-based semiconductor layer 20 can be achieved with the ELO method.

For example, when the GaN-based semiconductor layer 20 is formed of InGaN, In is added to GaN to form the GaN-based semiconductor layer 20 of the InGaN layer. Also in this case, it is important to perform film formation at a low temperature.

Other Configuration

In the semiconductor substrate 1, the third portion S3 of the GaN-based semiconductor layer 20 may have an impurity concentration distribution in the X-axis direction. In the semiconductor substrate 1, the third portion S3 may include an inner side portion adjacent to the opening portion 120 in plan view and an outer side portion farther from the opening portion 120 than the inner side portion in plan view and having an impurity concentration lower than that in the inner side portion. More specifically, in the m-plane cross section described above, the outer side portion described above of the third portion S3 is located on the side closer to the end surface of the GaN-based semiconductor layer 20 (farther from the opening portion 120). The inner side portion described above of the third portion S3 is located on the side closer to the opening portion 120, and is adjacent to the opening portion 120. The impurity concentration may be lower in the outer side portion described above than in the inner side portion described above. The distribution of the impurity concentration of the third portion S3 can be measured by analyzing the third portion S3 in the X-axis direction by SIMS. As regards the impurity concentration of the third portion S3, for example, when the GaN-based semiconductor layer 20 includes Si as an n-type dopant, the impurity concentration can be distributed in the third portion S3 by controlling the supply amount of Si during the formation of the GaN-based semiconductor layer 20.

In the third portion S3, the outer side portion described above (farther from the opening portion 120) has a relatively low impurity concentration. Therefore, by selecting the position where the electronic component forming region AR10 is set in the surface of the first portion S1, it is also possible to change the impurity concentration in the surface of the GaN-based semiconductor layer 20 on the opposite side of the electronic component forming region AR10.

The fourth portion S4 and the fifth portion S5 may also have the impurity concentration distributed in the X-axis direction. In this case, in the m-plane cross section described above, the fourth portion S4 may have a lower impurity concentration in a portion closer to the end surface of the GaN-based semiconductor layer 20 (a portion farther from the opening portion 120; the outer side portion) than in a portion closer to the opening portion 120 (the inner side portion). In the m-plane cross section described above, the fifth portion S5 may have a lower impurity concentration in a portion closer to the end surface of the GaN-based semiconductor layer 20 (a portion farther from the opening portion 120; the outer side portion) than in a portion closer to the opening portion 120 (the inner side portion).

A semiconductor substrate according to an aspect of the present disclosure includes: a base substrate; a mask layer that is located on the base substrate and includes an opening portion and a mask portion; and a semiconductor layer that includes a GaN-based semiconductor and is located over the base substrate exposed through the opening portion and over the mask portion. The semiconductor layer includes a first portion located on the mask portion and a second portion located on the opening portion. The dislocation density of non-threading dislocations in a cross section of the semiconductor layer taken along a thickness direction is higher in the first portion than in the second portion. A surface of the first portion includes an electronic component forming region.

There has been considerable demand for further improvement in the quality of GaN-based semiconductor layer. According to one aspect of the present disclosure, the threading dislocation density of the first portion can be reduced and the quality of the semiconductor layer can be improved. Thus, the semiconductor substrate can be provided that enables a high-quality semiconductor device to be produced.

Second Embodiment

Another embodiment of the present disclosure will be described below. Note that, for convenience of description, a member having the same function as that of a member described in the embodiments described above is denoted by the same reference sign, and description thereof will not be repeated. The same applies to the following embodiments.

In the present embodiment, a semiconductor device produced using the semiconductor substrate 1 described in the first embodiment will be described with reference to the drawings.

Figure 4:
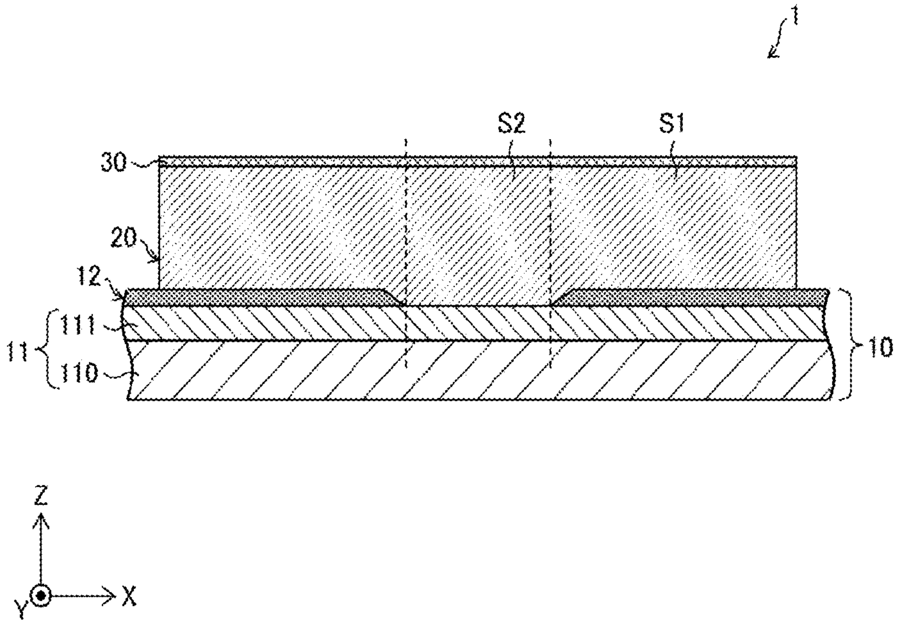
FIG. 4 is a cross-sectional view illustrating a semiconductor substrate on which a device layered structure is formed.
Figure 5:
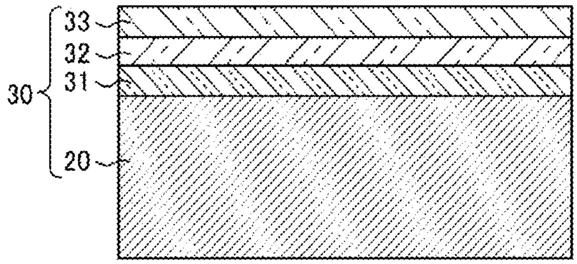
FIG. 5 is an enlarged view of part of FIG. 4 and is a cross-sectional view of the device layered structure.

FIG. 4 is a cross-sectional view illustrating the semiconductor substrate 1 on which a device layered structure 30 according to an example of the present disclosure is formed. FIG. 5 is a cross-sectional view illustrating the device layered structure 30 and is an enlarged view illustrating part of FIG. 4.

As illustrated in FIG. 4 and FIG. 5, when a device is produced using the semiconductor substrate 1, the device layered structure 30 is formed on the semiconductor substrate 1. The device layered structure 30 includes the GaN-based semiconductor layer 20, an active layer 31, an electron blocking layer 32, and a p-type GaN-based semiconductor layer 33.

When Device Layered Structure Is LED

As an example, a description is given below of a case where the device layered structure 30 formed on the surface of the first portion S1 of the semiconductor substrate 1 is an LED. In this case, the active layer 31 is, for example, a Multi-Quantum Well (MQW: InGaN/GaN) having a five- or six-period structure. The In composition in the active layer 31 may vary depending on the intended emission wavelengths. For example, the In concentration is set to be from about 15 to 20% for blue light (near the 450 nm wavelength) and to be about 30% for green light (near the 530 nm wavelength).

The electron blocking layer 32 is, for example, an AlGaN layer that generally has an Al composition of from about 15 to 25% and a thickness of from 5 to 25 nm. The p-type GaN-based semiconductor layer 33 is a GaN layer, for example, and the GaN layer has a thickness of from 0.1 to 0.3 μm, for example.

Although not illustrated in the drawings, the device layered structure 30 may have a $P^{++}$ layer (a highly doped layer of Mg dopant) having a thickness of about 10 nm formed on a surface of the p-type GaN-based semiconductor layer 33. The GaN-based semiconductor layer 20 and the device layered structure 30 may be continuously formed without being taken out from the MOCVD device. Further, in order to polish and flatten the surface of the semiconductor substrate 1, the semiconductor substrate 1 may be taken out from the MOCVD device or any of various film formation devices after the GaN-based semiconductor layer 20 has been formed. Thereafter, the surface of the GaN-based semiconductor layer 20 may be planarized by polishing, chemical mechanical polish (CMP), or the like, and then the semiconductor substrate 1 may be placed again in the film formation device described above to form the device layered structure 30.

Examples of the various film formation devices include a sputtering device, a remote plasma CVD device (RPCVD), and a pulse sputter deposition (PSD) device. The remote plasma CVD device, the PSD device, and the like can form a film at a low temperature and do not use hydrogen as a carrier gas. Thus, the p-type GaN-based semiconductor layer 33 having a low resistance can be obtained with such devices.

The type of film formation device used may be changed to be different before and after polishing or CMP of the surface of the semiconductor substrate 1.

When the GaN-based semiconductor layer 20 after the formation of the GaN-based semiconductor layer is taken out from the film formation device and polishing and the like is performed thereon, an n-type GaN-based semiconductor layer may be inserted between the GaN-based semiconductor layer 20 and the active layer 31. The thickness of the n-type GaN-based semiconductor layer is suitably from about 0.2 to 4 μm.

The semiconductor substrate 1 according to an aspect of the present disclosure can be also used for producing a surface-emitting device. When a surface-emitting laser device is produced, the device layered structure 30 is basically similar to that in the case of an LED, but there are some differences in the device process as described below.

Case where Device Layered Structure is Laser Diode)

As another example, a case where the device layered structure formed on the surface of the first portion S1 of the semiconductor substrate 1 is a laser diode (LD) will be described below. The device layered structure of this example is similar to that in the case of the LED described above and may be the structure of a typical LD, and therefore will not be illustrated or described in detail. Schematically, in the device layered structure in the case of an LD, p-type and n-type optical guiding layers are added above and below the active layer 31. The optical guide layer is an InGaN layer having a thickness of approximately 50 nm and having an In composition of from about 3 to 10%.

Further, in the device layered structure in the case of the LD, a p-type optical cladding layer is added on the outer side of the p-type optical guide layer described above and an n-type optical cladding layer is added on the outer side of the n-type optical guide layer described above so as to sandwich the p-type optical guide layer, the active layer 31, and the n-type optical guide layer. As the optical cladding layer described above, a GaN-based semiconductor layer, an AlGaN-based semiconductor layer, or an AlInGaN-based semiconductor layer may be selected. The p-type optical cladding layer described above may have a thickness of from 0.4 to 1.0 μm. The n-type optical cladding layer described above may have a thickness of from 0.8 to 2.0 μm.

Each part of the device layered structure in the case of the LD may be appropriately optimized depending on the purpose and application of the device to be produced.

By using the semiconductor substrate 1 according to an aspect of the present disclosure, the device layered structure 30 can be produced by using a general recipe (film formation conditions: for example, a film forming recipe of MOCVD). Therefore, no optimization needs to be newly performed for the film formation conditions. It is a matter of course that the semiconductor substrate 1 according to an aspect of the present disclosure may be used to optimize the film formation conditions.

Note that the configuration is not limited to the above example, and various device layered structures 30 can be formed on the GaN-based semiconductor layer 20.

Device Process for Device Layered Structure

A step of performing a device process on the device layered structure 30 formed on the semiconductor substrate 1 will be described. When a device is formed using the semiconductor substrate 1, there is an advantage in that a general device process can be applied.

FIG. 6 is a diagram illustrating an example of a device process for producing an LED. Hereinafter, for convenience of description, a member in a state after the device layered structure 30 has been formed on the semiconductor substrate 1 and an electrode has been formed on a surface of the device layered structure 30 is referred to as a first intermediate device 50.

Figure 6A:
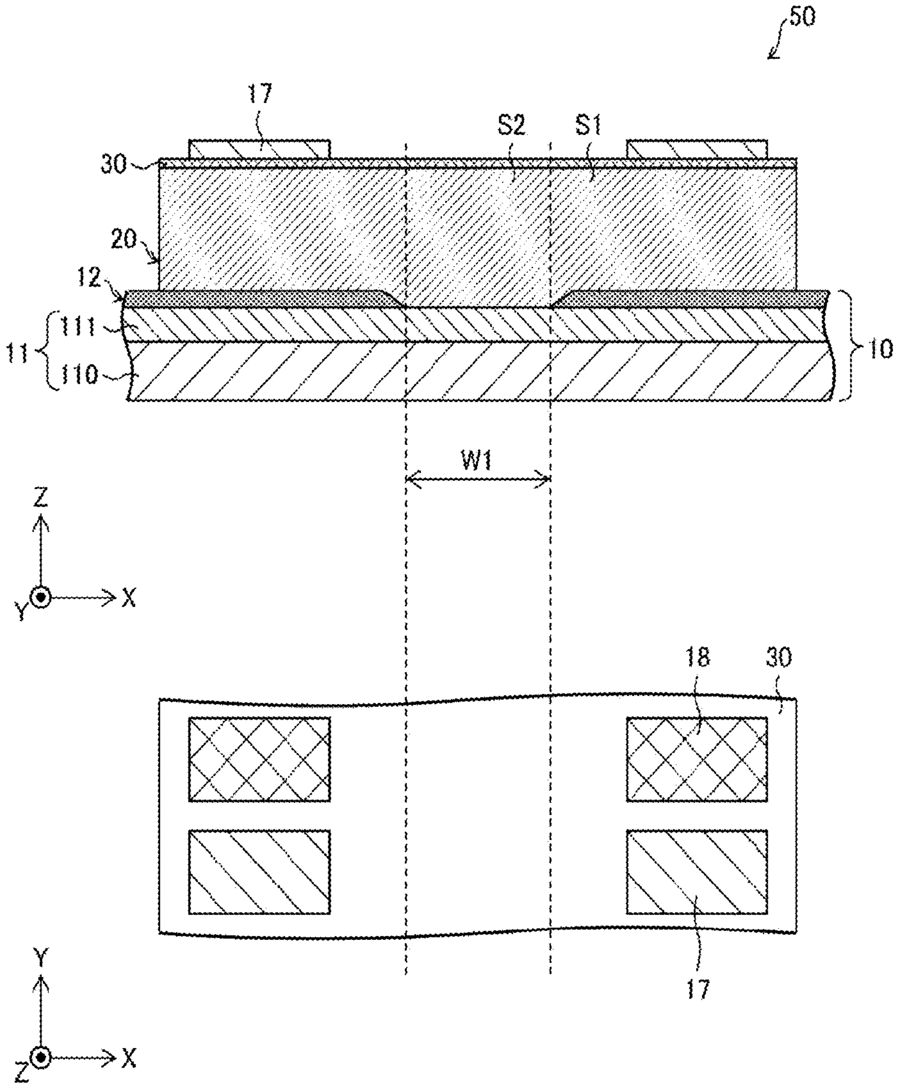
FIG. 6A is a schematic view illustrating an example of a device process for producing an LED.

As illustrated in FIG. 6A, the first intermediate device 50 includes a p-type electrode portion 17 and an n-type electrode portion 18 on the surface of the device layered structure 30. The p-type electrode portion 17 includes a p-type contact electrode and a pad electrode. The n-type electrode portion 18 includes an n-type contact electrode and a pad electrode. The first intermediate device 50 in this example has a single-sided two electrode structure (a structure in which the two electrodes that are the p-type electrode portion 17 and the n-type electrode portion 18 are formed on one surface).

In the region where the n-type electrode portion 18 is formed, the n-type GaN-based semiconductor layer is exposed in advance by a photolithography process and a dry etching process, and the n-type electrode portion 18 is formed on the surface of the region. In one example, the n-type electrode portion 18 is formed by plating or the like using a Ti/Al electrode as the n-type contact electrode and using Mo/Au or the like as a pad electrode.

The p-type electrode portion 17 is formed on the p-type GaN-based semiconductor layer 33. In one example, a Ag/Ni electrode or the like is used as the p-type contact electrode. The Ag electrode in the p-type electrode portion 17 is in contact with a p-type semiconductor layer and serves as a reflective layer for reflecting light from the active layer to the back surface. For the electrode pad in the p-type electrode portion 17, W/Au or the like is used. The p-type electrode portion 17 is formed by plating or the like.

As described above, the n-type contact electrode is dry-etched and formed at a position lower than the p-type contact electrode. Therefore, the pad electrode formed on the n-type contact electrode may be formed thick, to make the height of the pad surface of the n-type electrode equal to the height of the pad surface of the p-type electrode. As a result, bonding to a carrier substrate can be very easily performed in the later step, whereby the yield in the step of bonding to the carrier substrate can be increased.

Peeling Process

As described above, the first intermediate device 50 functions when the device layered structure 30 is formed on the semiconductor substrate 1 and the device process is performed on the device layered structure 30. However, in the light emitting element using the GaN-based semiconductor, light emitted from the GaN-based semiconductor layer 20 functioning as the active layer is absorbed by a heterogeneous substrate (a silicon substrate for example), and thus a device chip may be peeled from the heterogeneous substrate.

Figure 6B:
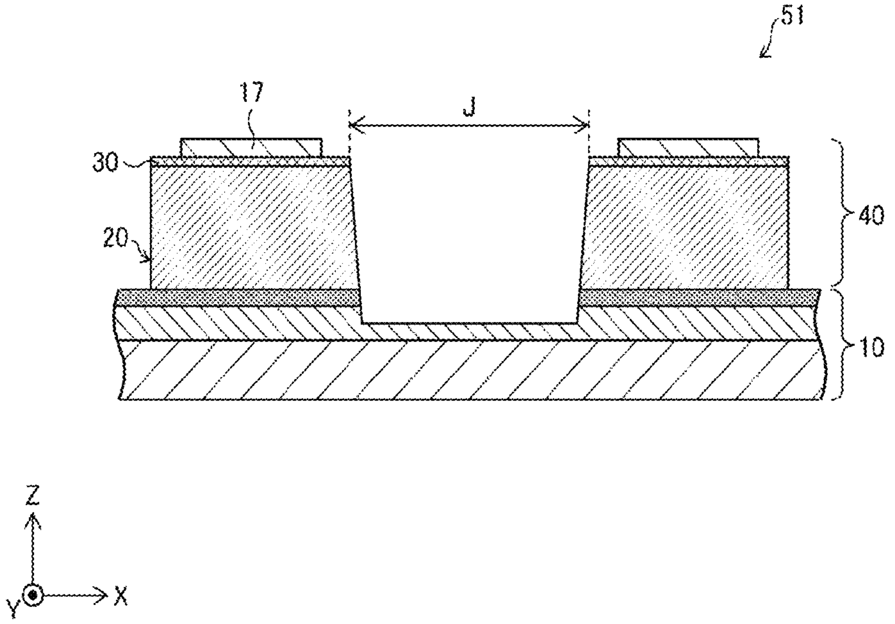
FIG. 6B is a cross-sectional view schematically illustrating a second intermediate device after etching processing has been executed on a first intermediate device after the device process in FIG. 6A.
Figure 6C:
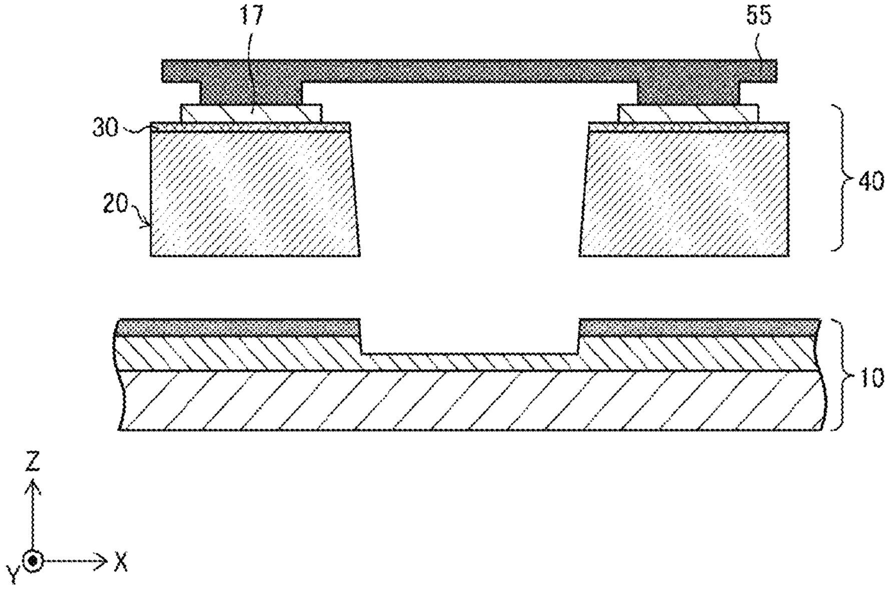
FIG. 6C is a cross-sectional view illustrating how a light emitting element is peeled from the mask portion using a stamp.

While the peeling can be performed by a plurality of methods, a method of peeling using gas phase etching is described herein with reference to FIG. 6B and FIG. 6C as an example of the peeling process.

In the semiconductor substrate 1 according to an aspect of the present disclosure, the GaN-based semiconductor layer 20 and the base substrate 11 are chemically bonded to each other in the opening portion 120. On the other hand, the GaN-based semiconductor layer 20 and the mask portion 121 are bonded to each other with weak force (for example, van der Waals force). Therefore, a portion of the GaN-based semiconductor layer 20 overlapping with the opening portion 120 in plan view and a coupling portion between the GaN-based semiconductor layer 20 and the base substrate 11 (foundation layer 111) are removed by gas phase etching. Thus, the GaN-based semiconductor layer 20 and the device layered structure 30 can be easily peeled from the template substrate 10.

FIG. 6B is a cross-sectional view schematically illustrating a second intermediate device 51 after etching processing has been executed on the first intermediate device 50 illustrated in FIG. 6A.

As illustrated in FIG. 6B, portions of the GaN-based semiconductor layer 20 and the device layered structure 30 above the opening portion 120 are etched by gas phase etching. At this time, the GaN-based semiconductor layer 20 on the opening portion 120 is etched so that at least part of the mask portion 121 is exposed. Thus, the etching may be performed with an etching depth being deeper than the thickness of the GaN-based semiconductor layer 20. Furthermore, the etching may be performed to make an opening width J above the etching region wider than the width W1 of the opening portion (W1<J). Thus, the coupling portion between the GaN-based semiconductor layer 20 and the base substrate 11 in the opening portion 120 is also removed by gas phase etching.

One unit including the GaN-based semiconductor layer 20, the device layered structure 30, one p-type electrode portion 17, and one n-type electrode portion 18 is referred to as a light emitting element 40.

FIG. 6C is a cross-sectional view illustrating how the light emitting element 40 is peeled from the mask portion 121 using a stamp 55.

As illustrated in FIG. 6C, the light emitting element 40 can be easily peeled from the mask portion 121 using the stamp 55. The stamp 55 may be a viscoelastic elastomer stamp, a polydimethylsiloxane (PDMS) stamp, an electrostatic adhesive stamp, or the like. With the light emitting element 40 thus being directly removable from the mask portion 121, a huge advantage can be obtained in terms of cost, throughput, and the like.

No dark spot or dark line was observed in the light emitting region of the light emitting element 40, when measuring, by the CL method, a defect state of the surface of the light emitting element 40 (a micro LED element for example) obtained by the peeling.

Mounting on Circuit Board

A description will be given of a method of transferring and mounting the light emitting element 40 separated from the base substrate 11, onto an electrically wired mounting substrate. Here, a description is given using a micro LED display as an example.

Figure 7:
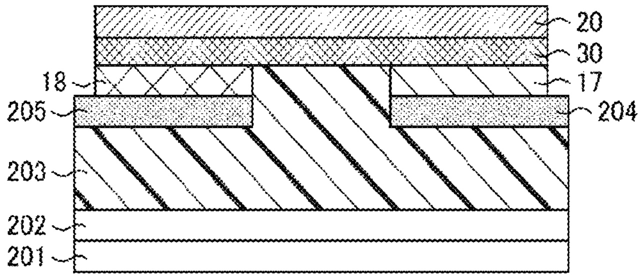
FIG. 7 is a cross-sectional view illustrating an example of a configuration in which the light emitting element is flip-chip mounted on a circuit board.

The light emitting element (LED) 40 selectively peeled is temporarily disposed on another intermediate plate (not illustrated) with the adhesive force of a stamp or the like. The light emitting element 40 is inverted upside down by being re-transferred and is flip-chip mounted on the circuit board. FIG. 7 is a cross-sectional view illustrating an example of a configuration in which the light emitting element 40 is flip-chip mounted on a circuit board 201.

As illustrated in FIG. 7, using the circuit board 201 (for example, a TFT substrate) with a surface on which a reflective layer 202 is formed, an adhesive layer 203 for holding a chip, a p-type wiring electrode 204, and an n-type wiring electrode 205 are arranged in layers above the circuit board 201. The light emitting element 40 is flip-chip mounted on the circuit board 201. Thus, the light emitting element 40 and the circuit board 201 are electrically connected to each other.

Figure 8:
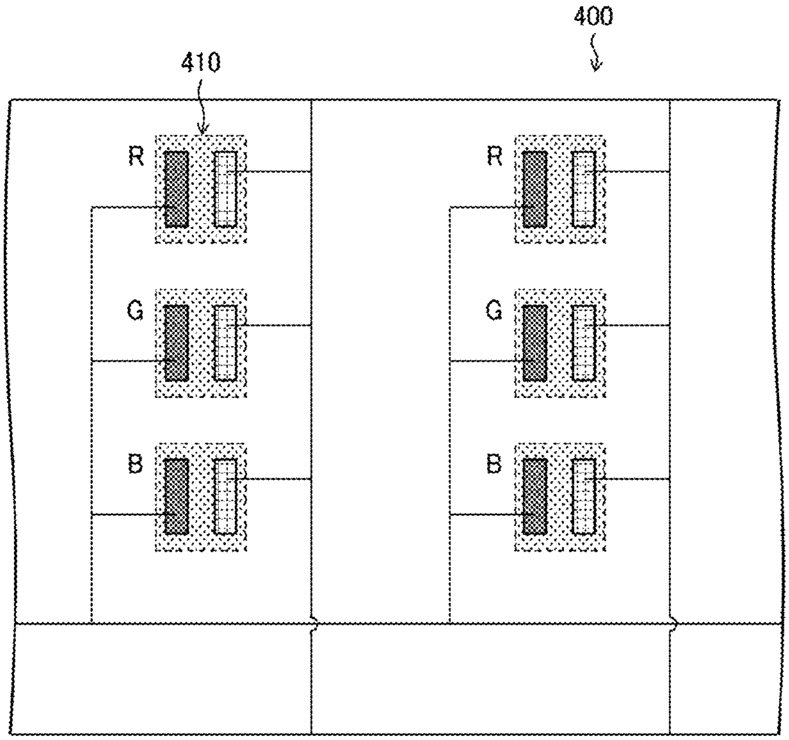
FIG. 8 is a schematic view illustrating part of a micro LED display in which the light emitting element is mounted on the circuit board.

FIG. 8 is a schematic view illustrating part of a micro LED display 400 in which the light emitting element 40 is mounted on the circuit board 201. As illustrated in FIG. 8, when a micro LED display is produced, LED chips 410 emitting blue (B), green (G), and red (R) light are mounted on the circuit board 201. Therefore, an LED chip for each of RGB is prepared on the individual semiconductor substrate 1. As described above, the light emitting element 40 for each of RGB is produced, and is mounted on the circuit board 201. By repeating these operations according to the display size, the micro LED display can be produced.

The example described above is given using as an example the micro LED element and the micro LED display. However, for example, a Fabry-Perot type laser and a vertical cavity surface emitting laser (VCSEL) can also be produced using the semiconductor substrate 1.

As described above, various electronic components such as the light emitting element 40 can be produced using the semiconductor substrate 1. Examples of the electronic component including the semiconductor substrate 1 include optical semiconductor elements such as an LED and a laser. The scope of the present disclosure further includes an electronic device including such an electronic component. Examples of the electronic device include a portable information terminal, a display (such as a television set), and a projector.

Third Embodiment

Figure 9:
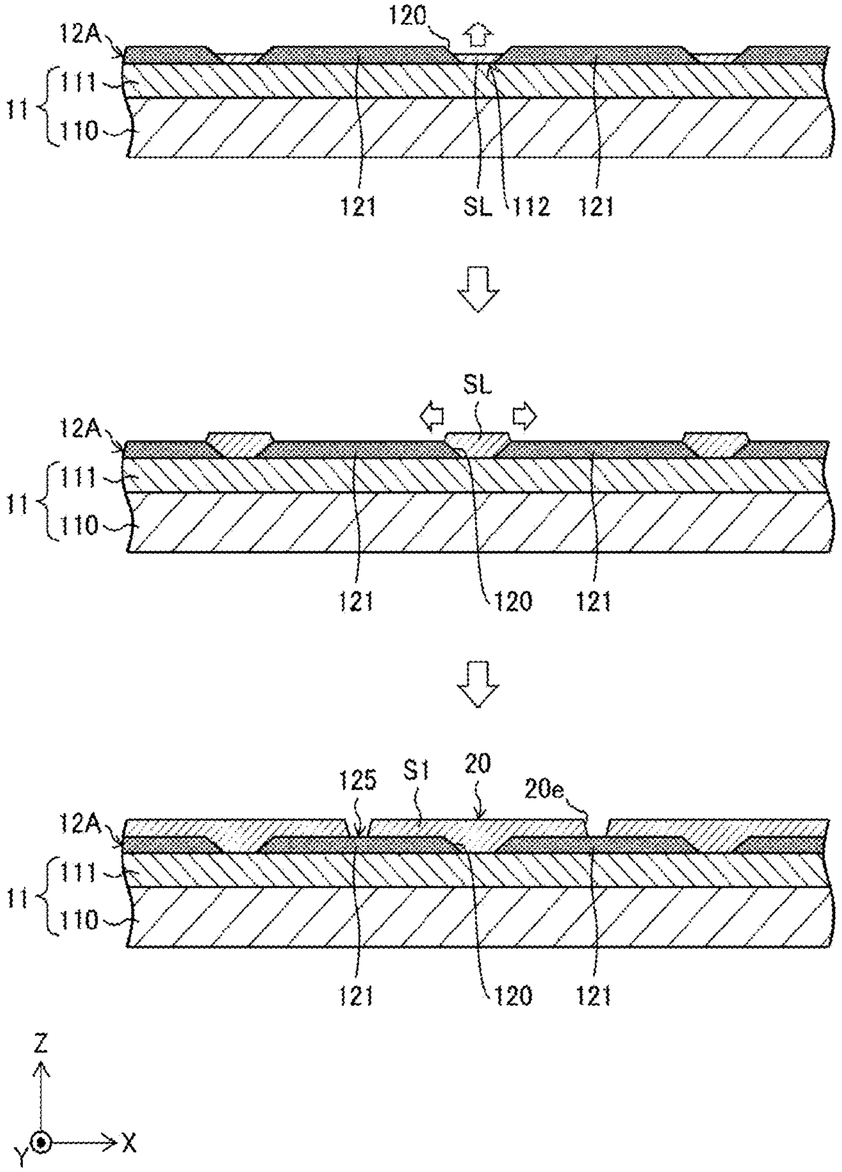
FIG. 9 is a cross-sectional view illustrating an example of lateral growth of a GaN-based semiconductor layer.

Another embodiment of the present disclosure will be described with reference to FIG. 9. FIG. 9 is a cross-sectional view illustrating an example of lateral growth of the GaN-based semiconductor layer 20.

In the present embodiment, an example in which the GaN-based semiconductor layer 20 is formed using the mask layer 12A having the plurality of opening portions 120 will be described, but the configuration is not limited to this. In other embodiments, the GaN-based semiconductor layer 20 may be similarly formed.

A portion of the foundation layer 111 exposed through the opening portion 120 of the mask layer 12 is referred to as a seed portion 112. The GaN-based semiconductor layer 20 is formed by the ELO method using the seed portion 112 as a starting point.

As illustrated in FIG. 9, preferably, an initial growth layer SL is formed on the seed portion 112 overlapping with the opening portion 120, and then the GaN-based semiconductor layer 20 is laterally grown from the initial growth layer SL. The initial growth layer SL serves as a starting point of lateral growth of the GaN-based semiconductor layer 20.

When the GaN-based semiconductor layer 20 is formed, the film formation of the initial growth layer SL is stopped at a timing immediately before the edge of the initial growth layer SL grows onto the upper surface of the mask portion 121 (at a timing when the edge is in contact with the upper end of the side surface of the mask portion 121) or immediately after the edge has grown onto the upper surface of the mask portion 121 (that is, at such a timing, the ELO film formation conditions are switched from the c-axis direction film formation conditions to the a-axis direction film formation conditions). With such a configuration, since the lateral film formation is performed from a state where the initial growth layer SL slightly protrudes from the mask portion 121, consumption of the material for the growth of the GaN-based semiconductor layer 20 in the thickness direction can be reduced, and the GaN-based semiconductor layer 20 can be effectively laterally grown at a high rate. The initial growth layer SL may be formed to have a thickness of, for example, 2.0 μm or more and 3.0 μm or less.

By laterally growing the GaN-based semiconductor layer 20 after forming the initial growth layer SL as illustrated in FIG. 9, the non-threading dislocations inside the first portion S1 can be increased (the threading dislocation density in the surface of the first portion S1 can be reduced). The distribution of the impurity concentration (for example, silicon, oxygen) inside the first portion S1 can be controlled. The GaN-based semiconductor layer 20 can be grown in the Z direction (c axis direction) or in the X direction (a axis direction) by appropriately controlling the conditions while the GaN-based semiconductor layer 20 is being formed.

As illustrated in FIG. 9, in the semiconductor substrate 1 according to the present embodiment, the first portion S1 of the GaN-based semiconductor layer 20 is located between the opening portion 120 and a center 125 of the mask portion 121 in plan view. In the semiconductor substrate 1 according to the present embodiment, the GaN-based semiconductor layer 20 has an edge surface (edge) 20*e* located between the opening portion 120 on the mask portion 121 and the center 125 of the mask portion 121.

After the plurality of GaN-based semiconductor layers 20 have been formed, polishing or CMP may be performed on the surfaces of the GaN-based semiconductor layers 20 (for more details, see a fourth embodiment described below). Thus, the flatness of the surface of the GaN-based semiconductor layer 20 and the in-plane distribution of the height of the surface of the GaN-based semiconductor layer 20 can be improved. As a result, the in-plane distribution of the layers when forming the device layered structure 30 is suppressed, and the yield can be effectively improved. When the surface of the GaN-based semiconductor layer 20 is polished, the opening width W1 of the opening portion 120 may be 0.1 μm or more.

Fourth Embodiment

Another embodiment of the present disclosure will be described below.

The description above is given with the semiconductor substrate 1 described in the first embodiment being the semiconductor substrate 1 having one GaN-based semiconductor layer 20 grown from one opening portion 120. In the present embodiment, a description will be given of a semiconductor substrate 1A having a GaN-based semiconductor layer 20A formed with a plurality of GaN-based semiconductor layers 20 aggregated, by using a mask layer 12A having a plurality of opening portions 120.

FIG. 10 is a diagram illustrating the semiconductor substrate 1A according to the present embodiment.

Figure 10A:
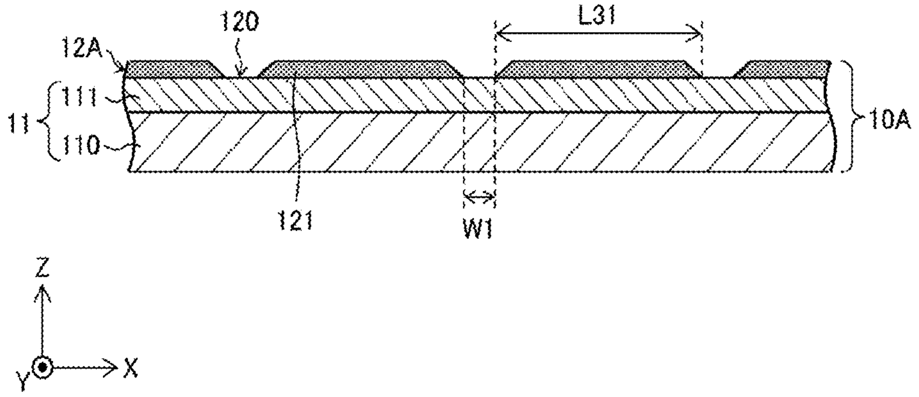
FIG. 10A is a cross-sectional view of a template substrate in a semiconductor substrate according to a fourth embodiment of the present disclosure.

As illustrated in FIG. 10A, first, a template substrate 10A is prepared with the mask layer 12A formed on the base substrate 11. The mask layer 12A includes the plurality of opening portions 120. The mask layer 12A includes a plurality of mask portions 121 formed on the base substrate 11 and the plurality of opening portions 120 that have a slit shape and are provided between the mask portions 121. Thus, in the mask layer 12A, the plurality of mask portions 121 may be provided in a stripe shape.

In the mask layer 12A, for example, the length of one mask portion 121 in the X-axis direction (that is, a mask width L31) may be 25 μm or more and 200 μm or less. In other words, in the mask layer 12A, for example, the pitch of the plurality of opening portions 120 in the X-axis direction may be 25 μm or more and 200 μm or less.

In the mask layer 12A, the opening width W1 of the opening portion 120 may be 0.5 μm or more and 20 μm or less, or may be 1 μm or more and 5 μm or less. In the mask layer 12A, the opening width W1 may be 6 μm or more and 7 μm or less, or may be 3 μm or more and 5 μm or less, for example.

In a specific example, the width L31 of the mask portion 121 is 50 μm, and the opening width W1 of the opening portion 120 is 5 μm, but the widths are not limited to these.

Figure 10B:
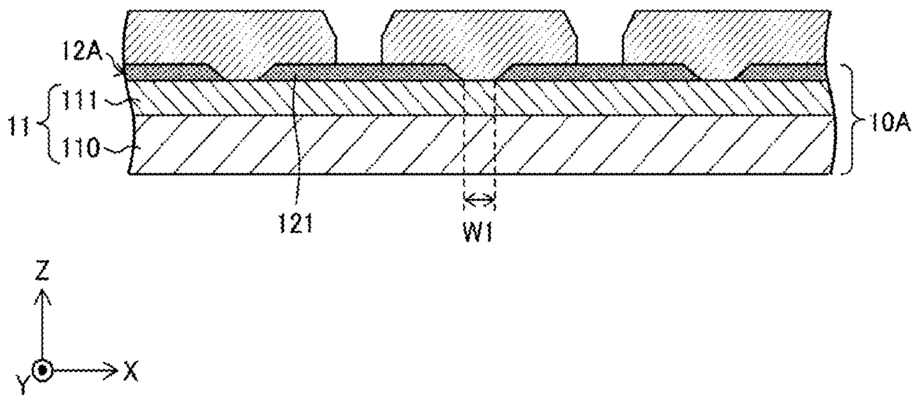
FIG. 10B is a cross-sectional view illustrating a state before aggregation of GaN-based semiconductor layers in the semiconductor substrate according to the fourth embodiment of the present disclosure.

As illustrated in FIG. 10B, the GaN-based semiconductor layers 20 are formed on the template substrate 10A. At this time, the plurality of GaN-based semiconductor layers 20 are grown with the surface (the seed portion 112, see FIG. 9) of the foundation layer 111 exposed through each of the plurality of opening portions 120 being the starting points. As each of the plurality of GaN-based semiconductor layers 20 grow, one of the GaN-based semiconductor layers 20 laterally grown from a certain opening portion 120 and another one of the GaN-based semiconductor layers 20 laterally grown from the opening portion 120 adjacent to the certain opening portion 120 aggregate together. As a result, the semiconductor substrate 1A is produced with the integrated GaN-based semiconductor layer 20A covering the mask layer 12A formed on the template substrate 10A.

Figure 10C:
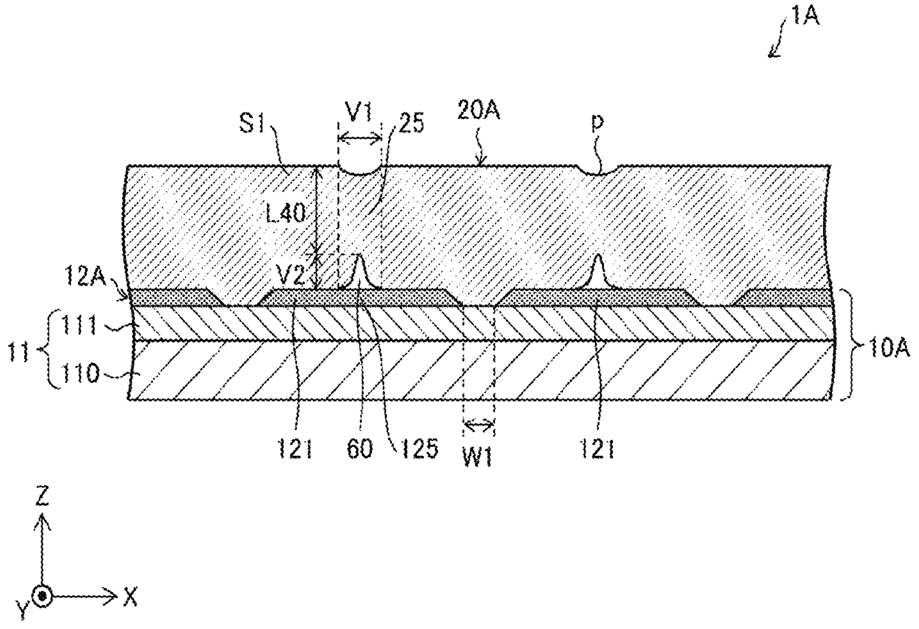
FIG. 10C is a cross-sectional view illustrating the semiconductor substrate in a state where the GaN-based semiconductor layers have aggregated together and grown, after the state in FIG. 10B.

As illustrated in FIG. 10C, the semiconductor substrate 1A includes the GaN-based semiconductor layer 20A formed as a result of the aggregation of the GaN-based semiconductor layers 20 that are adjacent to each other. The GaN-based semiconductor layer 20A includes an aggregation portion 25 adjacent to the first portion S1. The GaN-based semiconductor layer 20A has an integrated shape without the edge surface 20*e* (see FIG. 9) on the mask portion 121, and includes a void (hollow portion) 60 overlapping with the center 125 of the mask portion 121 in plan view. The semiconductor substrate 1A is produced by controlling the film formation conditions, the mask width, and the like, to form the void 60 in the aggregation portion 25 of the GaN-based semiconductor layer 20A. In the semiconductor substrate 1A, the first portion S1 is located between the opening portion 120 and the void 60 in plan view.

The void 60 is located on the surface of the mask portion 121 between the GaN-based semiconductor layer 20 and the mask portion 121. The shape of the void 60 is close to a triangular shape in cross-sectional view and spreads toward the surface of the mask portion 121. In other words, the void 60 has a shape with a width increasing toward the surface of the mask portion 121. With the void 60 having a triangular shape thus formed in the aggregation portion 25, an effect of largely reducing the internal stress of the GaN-based semiconductor layer 20A can be achieved. The void 60 extends in the Y-axis direction and thus can be regarded as a pyramid shape.

Generally, the thermal expansion coefficient of the material ($SiO_2$ or SiN) used for the mask portion 121 is smaller than that of the GaN-based semiconductor. Therefore, when the GaN-based semiconductor layer 20A is formed at a film formation temperature of about 1000° C., and then cooled to room temperature, the GaN-based semiconductor layer 20A may crack due to a difference in thermal expansion coefficient between the GaN-based semiconductor layer SL and the mask portion 121.

On the other hand, when the GaN-based semiconductor layer 20A is formed through aggregation involving the formation of the triangular void 60, the likelihood of cracking as described above can be effectively reduced. As illustrated in FIG. 10C, the width of the void 60 is denoted by V1 and the height of the void 60 is denoted by V2. A distance from the top of the void 60 to the surface of the GaN-based semiconductor layer 20 is denoted by L40.

As illustrated in FIG. 10C, the semiconductor substrate 1A may include a shallow depression (recess portion) p in the surface of the GaN-based semiconductor layer 20A above the void 60. The depth of the depression p may be 10 nm or more and 200 nm or less. The depression p may be located so as to overlap with the void 60 in plan view, that is, the void 60 may be immediately below the depression p to be formed. The depression p is anticipated to be formed due to the void 60 relaxing the internal stress of the GaN-based semiconductor layer 20A. Therefore, the semiconductor substrate 1A may have the depression p formed in the surface of the GaN-based semiconductor layer 20A.

The internal stress of the GaN-based semiconductor layer 20A can be effectively relaxed by making the height V2 of the void 60 1 μm or more. The width V1 of the void 60 (the width of the region where the GaN-based semiconductor layer 20 is not formed on the mask portion 121 in cross-sectional view) may be 1 μm or more, or 2 μm or more.

Depending on the film formation conditions for the GaN-based semiconductor layer 20A, the height V2 of the void 60 corresponds to the thickness of the GaN-based semiconductor layers 20 at the timing of the aggregation of the GaN-based semiconductor layers 20 that are adjacent to each other. The mask width of the mask portion 121 and the film formation conditions may be adjusted to set the height V2 of the void 60 low, that is, 15 μm or less. This is because, if the thickness of the GaN-based semiconductor layers 20 at the timing of the aggregation of the GaN-based semiconductor layers 20 that are adjacent to each other exceeds 15 μm, the supply of the film formation raw material between the two GaN-based semiconductor layers 20, upon the two GaN-based semiconductor layers 20 having approached each other, may be insufficient. In such a case, the two GaN-based semiconductor layers 20 may fail to aggregate together.

There is further merit in using the template substrate 10A in which the mask layer 12A with the mask width L31 of the mask portion 121 being larger than 25 μm is formed, when the thickness of the GaN-based semiconductor layers 20 when the GaN-based semiconductor layers 20 that are adjacent to each other aggregate is 13 μm or less. This is described below.

Figure 11A:
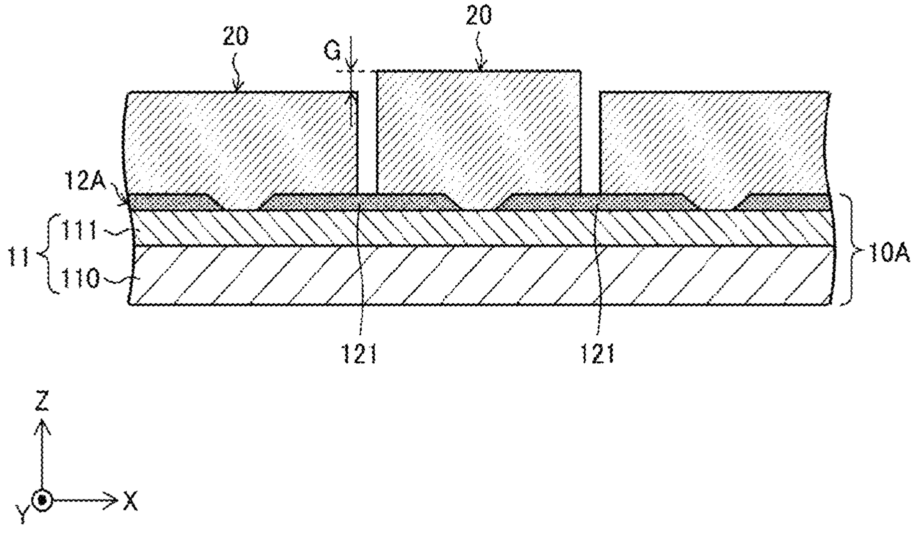
FIG. 11A is a cross-sectional view illustrating a state during the formation of the GaN-based semiconductor layers in the semiconductor substrate according to the fourth embodiment of the present disclosure.
Figure 11B:
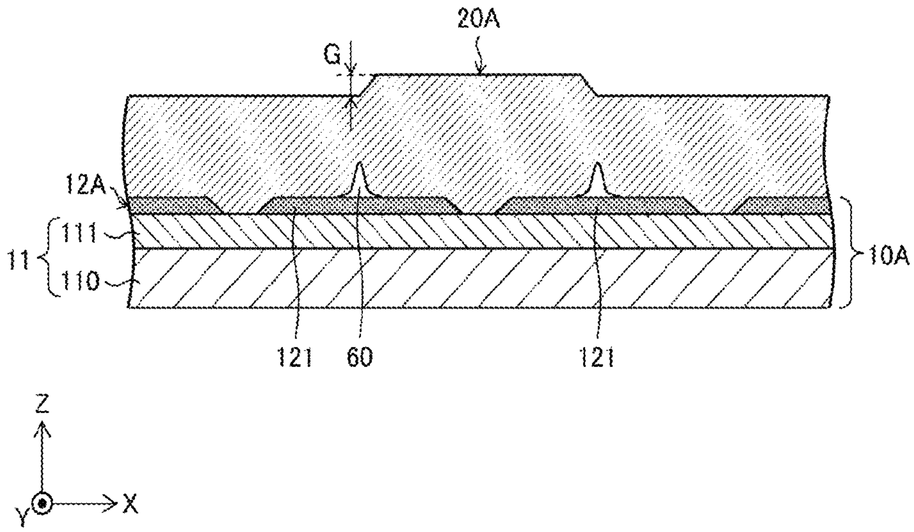
FIG. 11B is a cross-sectional view illustrating the semiconductor substrate during aggregation of the GaN-based semiconductor layers, which occurs after the state in FIG. 11A.
Figure 11C:
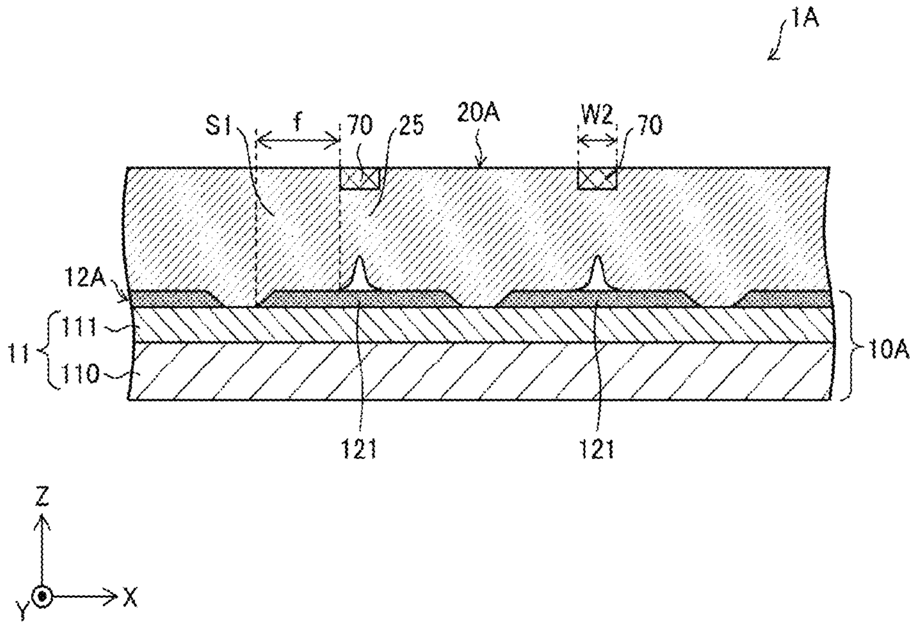
FIG. 11C is a cross-sectional view illustrating the semiconductor substrate in a state where the GaN-based semiconductor layers have aggregated together and grown, after the state in FIG. 11B.

FIG. 11 is a diagram illustrating a state where the GaN-based semiconductor layers 20 have been formed in the semiconductor substrate 1A.

As illustrated in FIG. 11A, for example, when the thicknesses of the GaN-based semiconductor layers 20 that are adjacent to each other are large, the GaN-based semiconductor layers 20 may have different thicknesses. This problem is likely to occur when a wide mask is used as the mask layer 12A. This is because of a long film formation distance in the lateral direction of the GaN-based semiconductor layers 20.

The GaN-based semiconductor layers 20 that are adjacent to each other and that have different thicknesses may result in a height gap G. In this case, when the GaN-based semiconductor layers 20 that are adjacent to each other are aggregated together, the formation of the GaN-based semiconductor layer 20A proceeds to offset the height gap G. In the GaN-based semiconductor layer 20A, the above-described void 60 and a defect concentration portion 70 containing many defects occurring at the time of aggregation are formed in the aggregation portion (aggregation portion 25) of the GaN-based semiconductor layers 20 that are adjacent to each other. The defect concentration portion 70 is assumed to be not included in the first portion S1 in FIG. 3.

It has been found that a larger height gap G results in a larger width (W2 in FIG. 11C) of the defect concentration portion 70 formed in the aggregation portion 25 of the GaN-based semiconductor layer 20A grown after the aggregation. It has been found that with the height V2 of the void 60 being 13 μm or less, the height gap G can be controlled to be small, and the width W2 of the defect concentration portion 70 can be reduced to be 10 μm or less. The height V2 of the void 60 can be set to 13 μm or less by setting, when the GaN-based semiconductor layers 20 that are adjacent to each other are aggregated together, the thicknesses of the GaN-based semiconductor layers 20 to 13 μm or less. With the width W2 of the defect concentration portion 70 reduced to be 10 μm or less, an effective width f of the first portion S1 where the device can be formed can be widened. As a result, the device production yield can be improved.

The semiconductor substrate 1A described above can ensure a large area of the low-dislocation region AR1 (see FIG. 1) where the device can be formed, as in the first embodiment. As a result, the semiconductor substrate 1A can be provided with which a high-quality semiconductor device can be produced.

Polishing

When the height gap G exists as described above, the surface morphology of the GaN-based semiconductor layer 20A may deteriorate. When the height gap G is too large, a step on the surface of the GaN-based semiconductor layer 20A due to the height gap G may fail to be offset by the subsequent film formation of the active layer or the like.

Therefore, polishing or CMP may be performed on the surface of the GaN-based semiconductor layer 20A. Thus, the flatness of the surface of the GaN-based semiconductor layer 20A and the in-plane distribution of the height of the surface of the GaN-based semiconductor layer 20A can be improved.

When the GaN-based semiconductor layers 20 are aggregated together under the presence of the height gap G, the width W2 of the defect concentration portion 70 is correlated with the thickness from the top of the void 60 to the surface of the GaN-based semiconductor layer 20A (the distance L40, see FIG. 10C). Immediately after the aggregation of the GaN-based semiconductor layers 20, the width W2 of the defect concentration portion 70 increases. Thus, the distance L40 described above may be 12 μm or less, and may be 6 μm or less. When the polishing or CMP is performed, the distance L40 described above can be reduced.

When the GaN-based semiconductor layer 20A is polished, M>h holds where M is the depth of polishing (h is defined as a difference in thickness between the thinnest and the thickest GaN-based semiconductor layers 20 in the semiconductor substrate 1A). For the sake of ensuring process likelihood, M may be larger than (h+0.2) μm. As a result, the semiconductor substrate 1A with a uniform surface height can be obtained.

The GaN-based semiconductor layer 20A may be polished by, for example, lapping polishing or buff polishing. In this case, the abrasive may include, for example, colloidal silica, an oxidizing agent, or a mixture of these. For example, when a mixture of colloidal silica and an oxidizing agent is used as the polishing agent, an affected layer can be formed by oxidizing only a few angstroms of the surface layer (top layer) of the GaN-based semiconductor layer 20A and the affected layer can be removed by the mechanical action of abrasive grains. Thus, the polishing time can be made short.

The surface of the GaN-based semiconductor layer 20A may be flattened by grinding or dissolving the surface of the GaN-based semiconductor layer 20A by polishing.

As the polishing technique, a polishing method known as Catalyst Surface Referred Etching (CARE) may be used. When CARE is employed, the surface of the GaN-based semiconductor can be planarized by two steps.

In this case, first, the surface of the GaN-based semiconductor layer 20A is polished by utilizing a photoelectrochemical reaction. For example, a catalytic pad having a surface on which $SiO_2$ is deposited and a quartz-made polishing table capable of transmitting an ultraviolet light source (Hg—Xe light source: light having wavelength shorter than the GaN band gap) during polishing are used to polish the GaN-based semiconductor layer 20A being irradiated with the ultraviolet light described above. The oxidation of the surface of the GaN-based semiconductor layer 20A is promoted by the light irradiation at a wavelength shorter than the band gap of the GaN-based semiconductor 20A and the oxidizing species of $H_2O$ and $O_2$ contained in a slurry. For example, $Ga_2O_3$ or the like is formed on the surface, and when acidic or basic polishing liquid is used, $Ga_2O_3$ is ionized and dissolved. Thus, the surface of the GaN-based semiconductor is gradually polished and flattened. In this step, a voltage of 2.5 V may be applied so that the GaN-based semiconductor layer 20A has a positive potential.

Next, the surface of the GaN-based semiconductor layer 20A is polished by utilizing the oxidation action of noble metal catalyst. Specifically, for example, a catalytic pad having a surface on which a Pt film is formed is used to polish the GaN-based semiconductor layer 20A. As a result, electrons move from the surface of the GaN-based semiconductor layers 20A to Pt, holes are generated in the valence band of the surface of the GaN-based semiconductor layer 20A, and the holes react with water molecules, whereby the surface of the GaN-based semiconductor layers 20A is oxidized. This surface oxide film is ionized and removed. Thus, the surface of the GaN-based semiconductor layer 20A can be polished.

Fifth Embodiment

With a semiconductor substrate according to a fifth embodiment of the present disclosure, an InGaN layer is formed as the GaN-based semiconductor layer 20, using a silicon substrate as the main substrate 110. As a result, the semiconductor substrate according to the fifth embodiment can be used as a pseudo InGaN substrate. Thus, the GaN-based semiconductor layer 20 of the semiconductor substrate according to the fifth embodiment can be used as a pseudo substrate to form the device layered structure. The In concentration of the InGaN layer may be, for example, from 3 to 5%.

Without the aggregation of the GaN-based semiconductor layers 20, the main substrate 110 (heterogeneous substrate) only affects the GaN-based semiconductor layers 20 on the opening portion 120. Thus, the device layered structure can be formed as if it is formed on the InGaN substrate. As a result, the stress from the semiconductor substrate is reduced in the high-composition In (region with an In composition of 25% or more) of a long-wavelength light emitting element. Thus, a high-quality active layer can be formed on the GaN-based semiconductor layers 20 while reducing the occurrence of defects.

With the above-described configuration, a green (530 nm) semiconductor laser diode and a red LED (610 to 630 nm) can be efficiently produced using the semiconductor substrate of the present embodiment including InGaN layers as the GaN-based semiconductor layers 20.

In the semiconductor substrate of the present embodiment, the GaN-based semiconductor layer 20 may or may not be aggregated.

Sixth Embodiment

In a sixth embodiment of the present disclosure, a Si substrate is used as the main substrate 110, and the formation of the GaN-based semiconductor layers 20 is stopped before the GaN-based semiconductor layers 20 that are adjacent to each other are aggregated. In this case, the semiconductor substrate has gaps between the plurality of GaN-based semiconductor layers 20. In the semiconductor substrate according to the sixth embodiment, the gap described above can effectively relax the internal stress (tensile stress) produced in the GaN-based semiconductor layers 20 due to a difference in thermal expansion coefficient between Si, which is the material of the main substrate 110, and the GaN-based semiconductor.

In a case where the thermal expansion coefficient of the main substrate 110 is smaller than the thermal expansion coefficient of the GaN-based semiconductor layers 20, the semiconductor substrate may have the GaN-based semiconductor layers 20 that have not been aggregated. In this case, the likelihood of the GaN-based semiconductor layer 20 cracking due to internal stress can be reduced. Thus, even when the GaN-based semiconductor layers 20 are thick, the likelihood of the GaN-based semiconductor layers 20 cracking can be reduced.

Seventh Embodiment

In a seventh embodiment of the present disclosure, a sapphire substrate is used as the main substrate 110, and the formation of the GaN-based semiconductor layers 20 is stopped after the aggregation of the GaN-based semiconductor layers 20 that are adjacent to each other. Internal stress (compressive stress) is generated in the GaN-based semiconductor layers 20 due to a difference in thermal expansion coefficient between sapphire, which is the material of the main substrate 110, and the GaN-based semiconductor.

When the thermal expansion coefficient of the main substrate 110 is larger than that of the GaN-based semiconductor layers 20, the semiconductor substrate may include the GaN-based semiconductor layer 20A formed with the GaN-based semiconductor layers 20 that are adjacent to each other aggregated together, and may have the void 60 in the aggregation portion 25 (see the fourth embodiment). In this case, internal stress in the GaN-based semiconductor layer 20A can be effectively relaxed. Therefore, a semiconductor substrate including a uniform GaN-based semiconductor layer 20A can be obtained.

Production Method and Production Device

A method and a production device for producing a semiconductor substrate according to an embodiment of the present disclosure as described above will be described below with reference to FIGS. 12 and 13.

Figure 12:
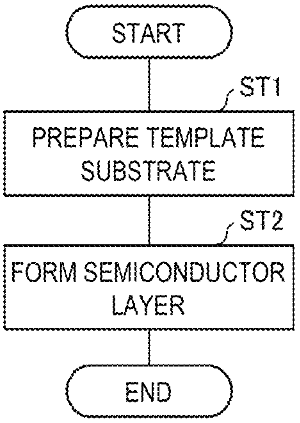
FIG. 12 is a flowchart showing an example of a method for producing a semiconductor substrate.

As illustrated in FIG. 12, the production method for producing the semiconductor substrate 1/1A according to an embodiment of the present disclosure may include step ST1 of preparing the template substrate 10/10A, and step ST2 of forming the GaN-based semiconductor layer 20/20A.

In step ST1 described above, the template substrate 10/10A including the base substrate 11 and the mask layer 12/12A that is located above the base substrate 11 and includes the opening portion 120 and the mask portion 121 is prepared.

In step ST2 described above, the first portion S1 located on the mask portion 121 and the second portion S2 located on the opening portion 120 are formed with the dislocation density of the non-threading dislocations D2 in a cross section of the second portion S2 taken along the thickness direction being lower than the dislocation density of the non-threading dislocations D2 in a cross section of the first portion S1 taken along the thickness direction.

Figure 13:
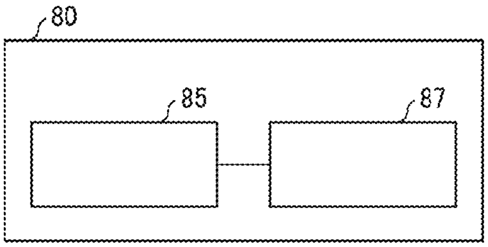
FIG. 13 is a block diagram illustrating an example of a configuration of a semiconductor substrate production device.

The semiconductor substrate 1/1A can be produced by, for example, a semiconductor substrate production device 80 illustrated in FIG. 13. The semiconductor substrate production device 80 includes at least a semiconductor layer forming unit 85 and a control unit 87.

The semiconductor layer forming unit 85 forms, on the template substrate 10/10A, the first portion S1 and the second portion S2, with the dislocation density of the non-threading dislocations D2 in the cross section of the second portion S2 taken along the thickness direction being lower than the dislocation density of the non-threading dislocations D2 in the cross section of the first portion S1 taken along the thickness direction. The controller unit 87 controls the semiconductor layer forming unit 85.

The semiconductor layer forming unit 85 may include an MOCVD device. The control unit 87 may include a processor and a memory. The control unit 87 may be configured to control the semiconductor layer forming unit 85 by executing a program stored in a built-in memory, a connectable communication device, or a connectable network, for example, and this program is also included in the present embodiment. The semiconductor substrate production device 80 may include a template substrate forming unit that performs a step of forming the foundation layer 111 and the mask layer 12 on the main substrate 110, and a layered structure forming unit that performs a step of forming the device layered structure 30 on the GaN-based semiconductor layers 20. A semiconductor device production device that further performs an element peeling step may be configured. The semiconductor device production device may perform an element separation step. The semiconductor device production device may include the semiconductor substrate production device 80.

Supplementary Note

In the present disclosure, the invention has been described above based on the various drawings and examples. However, the invention according to the present disclosure is not limited to each embodiment described above. That is, the embodiments of the invention according to the present disclosure can be modified in various ways within the scope illustrated in the present disclosure, and embodiments obtained by appropriately combining the technical means disclosed in different embodiments are also included in the technical scope of the invention according to the present disclosure. In other words, a person skilled in the art can easily make various variations or modifications based on the present disclosure. Note that these variations or modifications are included within the scope of the present disclosure.

REFERENCE SIGNS

1, 1A Semiconductor substrate
10, 10A Template substrate
11 Base substrate
110 Main substrate
111 Foundation layer (semiconductor film)
12 Mask layer
120 Opening portion
121 Mask portion
20 GaN-based semiconductor layer (semiconductor layer)
40 Light emitting element
AR10 Electronic component forming region
S1 First portion
S2 Second portion
S3 Third portion
S4 Fourth portion
S5 Fifth portion
S6 Sixth portion
S7 Seventh portion

The invention claimed is:

1. A semiconductor substrate comprising:
a base substrate;
a mask layer that is located on the base substrate, and comprises a first opening portion and a mask portion; and
a first semiconductor layer that comprises a GaN-based semiconductor located over the base substrate exposed through the first opening portion and over the mask portion,
wherein the first semiconductor layer comprises:
a first portion located on the mask portion, and
a second portion that is located on the first opening portion and has a lower dislocation density of non-threading dislocations in a cross section of the first semiconductor layer taken along a thickness direction than the first portion,
wherein the first portion comprises:
a third portion located on the mask portion, and
a fourth portion located closer to an upper surface of the first semiconductor layer than the third portion, and the fourth portion comprising a different impurity concentration from the third portion, and wherein an upper surface of the third portion comprises an incline with respect to the upper surface of the first semiconductor layer.

2. The semiconductor substrate according to claim 1, wherein in the first portion, a threading dislocation density on an upper surface of the first semiconductor layer is lower than a non-threading dislocation density in the cross section of the first semiconductor layer taken along the thickness direction.

3. The semiconductor substrate according to claim 1, wherein in the second portion, a threading dislocation density in an upper surface of the first semiconductor layer is higher than a non-threading dislocation density in the cross section of the first semiconductor layer taken along the thickness direction.

4. A semiconductor substrate comprising:

a base substrate;

a mask layer that is located on the base substrate, and comprises a first opening portion and a mask portion; and a first semiconductor layer that comprises a GaN-based semiconductor located over the base substrate exposed through the first opening portion and over the mask portion, wherein the first semiconductor layer comprises a first portion located on the mask portion, wherein the first portion comprises non-threading dislocations, wherein a threading dislocation density in the first portion is $5\times10^6/cm^2$ or lower, wherein the first portion comprises:

a third portion located on the mask portion, and a fourth portion located closer to an upper surface of the first semiconductor layer than the third portion, the fourth portion has a non-threading dislocation density lower than the third portion, and the fourth portion has a different impurity concentration from the third portion, and wherein an upper surface of the third portion is inclined with the upper surface of the first semiconductor layer.

5. The semiconductor substrate according to claim 1, wherein the first portion is located between the first opening portion and a center of the mask portion in plan view.

6. The semiconductor substrate according to claim 1, wherein the dislocation density of the non-threading dislocations in the first portion in the cross section of the first semiconductor layer taken along the thickness direction is $5\times10^8/cm^2$ or lower.

7. The semiconductor substrate according to claim 1, wherein the base substrate comprises:

a main substrate; and a semiconductor film that is located on the main substrate, overlaps with at least the first opening portion of the mask layer, and comprises GaN or a GaN-based semiconductor, and the first semiconductor layer is in contact with the semiconductor film.

8. The semiconductor substrate according to claim 1, wherein the fourth portion has a non-threading dislocation density lower than the third portion.

9. The semiconductor substrate according to claim 1, wherein in the cross section of the first semiconductor layer taken along the thickness direction, an impurity concentration of the first portion is higher than an impurity concentration in the second portion.

10. The semiconductor substrate according to claim 1, wherein the fourth portion has a lower impurity concentration than the third portion.

11. The semiconductor substrate according to claim 1, wherein the first portion comprises, in a surface of the first portion of the first semiconductor layer, a sixth portion, and a seventh portion that is located closer to the second portion than the sixth portion is, and has a lower impurity concentration than the sixth portion.

12. The semiconductor substrate according to claim 5, wherein the first semiconductor layer has an integrated shape without an edge on the mask portion, and comprises a hollow portion that overlaps with the center of the mask portion in plan view.

13. The semiconductor substrate according to claim 1, wherein the upper surface of the first semiconductor layer further comprises a dislocation region between a first boundary at a distance from a first edge of the first semiconductor layer and a second boundary at the distance from a second edge of the first semiconductor layer, the dislocation region comprising threading dislocations located in the surface of the first semiconductor layer, a difference region comprises a remaining surface area defined by subtracting an upper surface of the second portion from within the dislocation region is smaller than the upper surface of the second portion.

14. The semiconductor substrate according to claim 1, wherein a dislocation density of threading dislocations is higher in the second portion than in the first portion.

15. A method for producing a semiconductor substrate comprising:

preparing a template substrate comprising a base substrate and a mask layer that is located above the base substrate and comprises an opening portion and a mask portion; and forming a first portion that is located on the mask portion and comprises a GaN-based semiconductor, and a second portion that is located on the opening portion and comprises a GaN-based semiconductor, with a dislocation density of non-threading dislocations being lower in a cross section of the second portion taken along a thickness direction than in a cross section of the first portion taken along the thickness direction, wherein the first portion comprises:

a third portion located on the mask portion, and a fourth portion located closer to an upper surface of the first semiconductor layer than the third portion, and the fourth portion comprising a different impurity concentration from the third portion, and wherein an upper surface of the third portion comprises an incline with respect to the upper surface of the first semiconductor layer after the forming.

16. An electronic component comprising:

at least the first semiconductor layer of the semiconductor substrate described in claim 1.

17. An electronic device comprising:

the electronic component described in claim 16.

18. The semiconductor substrate according to claim 1, wherein a side surface of the mask portion is inclined with the surface of the base substrate.

19. The semiconductor substrate according to claim 1, wherein a side surface of the first semiconductor layer includes an inclined facet portion inclined with the upper surface of the first semiconductor layer.

20. The semiconductor substrate according to claim 1, wherein the mask layer comprises a second opening portion, the semiconductor substrate further comprises a second semiconductor layer that comprises the GaN-based semiconductor located over the base substrate exposed through the second opening portion and over the mask portion, and the first semiconductor layer and the second semiconductor layer are not in contact with each other.

* * * * *